(12) United States Patent
Lee

(10) Patent No.: US 11,238,951 B2
(45) Date of Patent: *Feb. 1, 2022

(54) MEMORY SYSTEM AND OPERATING METHOD OF THE SAME

(71) Applicant: SK hynix Inc., Gyeonggi-do (KR)

(72) Inventor: Jong-Min Lee, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/865,638

(22) Filed: May 4, 2020

(65) Prior Publication Data

US 2020/0265911 A1 Aug. 20, 2020

Related U.S. Application Data

(63) Continuation of application No. 15/968,164, filed on May 1, 2018, now Pat. No. 10,665,315.

(30) Foreign Application Priority Data

Oct. 11, 2017 (KR) .................. 10-2017-0129830

(51) Int. Cl.
| | |
|---|---|
| *G11C 29/38* | (2006.01) |
| *G11C 29/44* | (2006.01) |
| *G11C 29/04* | (2006.01) |
| *G11C 29/42* | (2006.01) |
| *G11C 16/04* | (2006.01) |

(52) U.S. Cl.
CPC .............. *G11C 29/38* (2013.01); *G11C 29/04* (2013.01); *G11C 29/42* (2013.01); *G11C 29/44* (2013.01); *G11C 16/0483* (2013.01); *G11C 2029/0409* (2013.01)

(58) Field of Classification Search
CPC ..... G11C 29/38; G11C 29/44; G11C 16/0483; G11C 2029/0409; G11C 29/42; G11C 29/04
USPC ....... 714/719, 718, 763, 764, 768, 773, 799; 365/200, 201, 185.09
See application file for complete search history.

(56) References Cited

U.S. PATENT DOCUMENTS

| | | | | |
|---|---|---|---|---|
| 7,444,462 | B2* | 10/2008 | Traister | G06F 12/0269 |
| | | | | 711/103 |
| 8,503,236 | B2* | 8/2013 | Lee | G11C 16/04 |
| | | | | 365/185.09 |
| 9,659,666 | B2* | 5/2017 | Yang | G11C 16/10 |
| 10,387,280 | B2* | 8/2019 | Wong | G06F 12/0246 |
| 10,665,315 | B2* | 5/2020 | Lee | G11C 29/42 |
| 2006/0039196 | A1* | 2/2006 | Gorobets | G11C 29/76 |
| | | | | 365/185.01 |

(Continued)

*Primary Examiner* — John J Tabone, Jr.
(74) *Attorney, Agent, or Firm* — IP & T Group LLP

(57) ABSTRACT

A memory system includes: a memory device that includes a plurality of memory blocks each of which includes a plurality of pages that store data; and a controller suitable for performing command operations corresponding to a plurality of commands received from a host on the memory blocks, detecting performance results of the command operations performed on the memory blocks, detecting, among the memory blocks, first memory blocks where performance of the command operations failed as bad blocks, and copying and storing valid data in the first memory blocks in second memory blocks of the memory blocks.

13 Claims, 13 Drawing Sheets

(56) References Cited

U.S. PATENT DOCUMENTS

| | | | |
|---|---|---|---|
| 2006/0123284 A1* | 6/2006 | Hwang | G11B 20/1879 714/718 |
| 2011/0161554 A1* | 6/2011 | Selinger | G06F 13/1668 711/103 |
| 2012/0005451 A1* | 1/2012 | Lee | G06F 12/0246 711/203 |
| 2012/0084627 A1* | 4/2012 | Post | G06F 11/1048 714/763 |
| 2014/0108702 A1* | 4/2014 | Mizushima | G06F 12/0246 711/103 |
| 2014/0157078 A1* | 6/2014 | Danilak | H03M 13/09 714/758 |
| 2014/0157083 A1* | 6/2014 | Shalvi | G06F 12/023 714/763 |
| 2015/0085575 A1* | 3/2015 | Tam | G11C 29/025 365/185.11 |
| 2016/0078946 A1* | 3/2016 | Byun | G11C 16/0483 365/185.12 |
| 2016/0092129 A1* | 3/2016 | Agarwal | G11C 11/5621 714/764 |
| 2016/0179385 A1* | 6/2016 | Byun | G06F 3/0604 711/154 |
| 2017/0010838 A1* | 1/2017 | Hong | G06F 11/1048 |
| 2017/0062067 A1* | 3/2017 | Yang | G11C 16/10 |
| 2017/0068615 A1* | 3/2017 | Nagata | G06F 12/00 |
| 2017/0125104 A1* | 5/2017 | Baran | G11C 16/349 |
| 2017/0255405 A1* | 9/2017 | Zettsu | G06F 12/0246 |
| 2017/0371781 A1* | 12/2017 | Choi | G06F 12/0246 |
| 2018/0024779 A1* | 1/2018 | Kojima | G06F 3/0604 711/103 |
| 2018/0068731 A1* | 3/2018 | Kim | G06F 3/0604 |
| 2018/0260132 A1* | 9/2018 | Wang | G06F 12/0246 |
| 2018/0357142 A1* | 12/2018 | Wong | G06F 11/1441 |
| 2019/0012109 A1* | 1/2019 | Byun | G06F 3/064 |
| 2019/0108891 A1* | 4/2019 | Lee | G11C 29/04 |
| 2020/0265911 A1* | 8/2020 | Lee | G11C 29/04 |

* cited by examiner

MEMORY SYSTEM AND OPERATING METHOD OF THE SAME

CROSS-REFERENCE TO RELATED APPLICATION(S)

This application is a continuation of U.S. patent application Ser. No. 15/968,164 filed on May 1, 2018, which claims benefits of priority of Korean Patent Application No. 10-2017-0129830 filed on Oct. 11, 2017. The disclosure of each of the foregoing application is incorporated herein by reference in its entirety.

BACKGROUND

1. Field

Various exemplary embodiments of the present invention generally relate to a memory system. Particularly, the embodiments relate to a memory system capable of processing data with a memory device, and method of operating the memory system.

2. Description of the Related Art

The computer environment paradigm is transitioning into ubiquitous computing, which enables computing systems to be used anytime and anywhere. Consequently, use of portable electronic devices such as mobile phones, digital cameras, and laptop computers has rapidly increased. These portable electronic devices generally use a memory system having one or more memory devices for storing data. The memory system in such devices may be used as a main memory device or an auxiliary memory device.

Memory systems provide excellent stability, durability, high information access speed, and low power consumption since they have no moving parts. Examples of memory systems having such advantages include universal serial bus (USB) memory devices, memory cards having various interfaces, and solid state drives (SSD).

SUMMARY

Various embodiments of the present invention are directed to a memory system that may quickly and stably process data to a memory device by minimizing complexity and performance deterioration of the memory system and maximizing utility efficiency of the memory device, and an operating method of the memory system.

In accordance with an embodiment of the present invention, a memory system includes: a memory device that includes a plurality of memory blocks each of which includes a plurality of pages that store data; and a controller suitable for performing command operations corresponding to a plurality of commands received from a host on the memory blocks, detecting performance results of the command operations performed on the memory blocks, detecting among the memory blocks, first memory blocks where performance of the command operations failed as bad blocks, and copying and storing valid data in the first memory blocks in second memory blocks of the memory blocks.

The controller may record information representing the bad blocks in a list in form of a bitmap, and store the list in a memory of the controller.

The memory device may include a plurality of planes each of which includes the memory blocks and a plurality of memory dies each of which includes the planes; and the controller may record the information representing the bad blocks among the memory blocks in the memory dies in rows of the list.

The controller may record the information representing the bad blocks among the memory blocks in each of the planes of the respective memory dies in bit regions of the respective rows of the list.

The controller may record the information representing the bad blocks among the memory blocks in a first plane of a first memory die in a first bit region of a first row of the list, and record the information representing the bad blocks among the memory blocks in a second plane of the first memory die in a second bit region of the first row of the list.

The controller may record the information representing the bad blocks among the memory blocks in a first plane of a second memory die in a first bit region of a second row of the list, and record the information representing the bad blocks among the memory blocks in a second plane of the second memory die in a second bit region of the second row of the list.

The controller may allocate first queues corresponding to the command operations and second queues corresponding to the first memory blocks to a memory of the controller.

The controller may store the valid data in the second queues, and subsequently store the valid data stored in the second queues in pages of the second memory blocks.

The controller may process the first memory blocks as closed memory blocks.

The valid data may be stored in valid pages where performance success of the command operations occurs among pages in the first memory blocks.

In accordance with an embodiment of the present invention, an operating method of a memory system, comprising: receiving a plurality of commands from a host for a memory device that includes a plurality of memory blocks each of which includes a plurality of pages that store data; performing command operations corresponding to the commands on the memory blocks using a controller; detecting performance results of the command operations that are performed on the memory blocks, and detecting, among the memory blocks, first memory blocks where performance of the command operations failed as bad blocks; and copying and storing valid data in the first memory blocks in second memory blocks of the memory blocks.

The method may further include: recording information representing the bad blocks in a list in form of a bitmap; and storing the list in a memory included in a controller.

The memory device may include a plurality of planes each of which includes the memory blocks and a plurality of dies each of which includes the planes, and the recording of the information representing the bad blocks may be carried out to record the information representing the bad blocks among the memory blocks in the memory dies in rows of the list.

The recording of the information representing the bad blocks may be carried out to record the information representing the bad blocks among the memory blocks in each of the planes of the respective memory dies in bit regions of the respective rows of the list.

The recording of the information representing the bad blocks may be carried out to record the information representing the bad blocks among the memory blocks in a first plane of a first memory die in a first bit region of a first row of the list and record the information representing the bad blocks among the memory blocks in a second plane of the first memory die in a second bit region of the first row of the list.

The recording of the information representing the bad blocks may be carried out to record the information representing the bad blocks among the memory blocks in a first plane of a second memory die in a first bit region of a second row of the list and record the information representing the bad blocks among the memory blocks in a second plane of the second memory die in a second bit region of the second row of the list.

The operating method may further include: allocating first queues corresponding to the command operations and second queues corresponding to the first memory blocks to a memory of the controller.

The storing of the valid data may include: storing the valid data in the second queues; and storing the valid data stored in the second queues in pages of the second memory blocks.

The operating method may further include: processing the first memory blocks as closed memory blocks.

The valid data may be stored in valid pages where performance success of the command operations occurs among pages in the first memory blocks.

In accordance with an embodiment of the present invention, a memory system includes: a memory device; and a controller suitable for: detecting a bad block in the memory device upon completion of an operation on the memory device; and controlling the memory device to copy valid data of the bad block into a normal block of the memory device.

DETAILED DESCRIPTION

Figure 1:
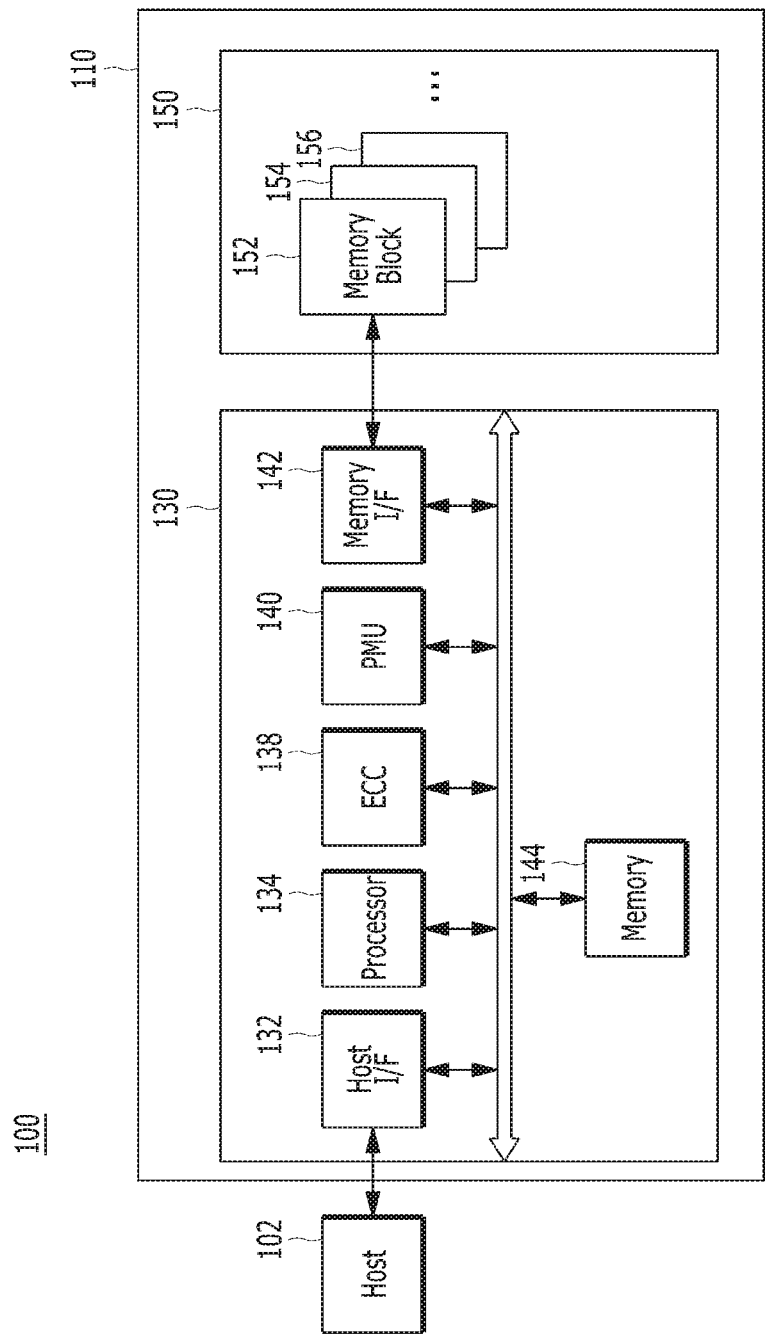
FIG. 1 is a block diagram illustrating a data processing system in accordance with an embodiment of the present invention.

Various embodiments of the present invention are described below in more detail with reference to the accompanying drawings. Such embodiments are presented for the purpose of illustration, not limitation. The described embodiments are provided so that this disclosure is thorough and complete and fully conveys the present invention to those skilled in the art to which this invention pertains. As those skilled in the art will realize from the following disclosure, the described embodiments may be modified in various ways without departing from the spirit and scope of the present invention. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed a second or third element without departing from the spirit and scope of the present invention.

The drawings are not necessarily to scale and, in some instances, proportions may have been exaggerated in order to clearly illustrate various features of the embodiments.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments and is not intended to be limiting of the present invention. As used herein, singular forms are intended to include the plural forms and vice versa, unless the context clearly indicates otherwise. The phrase "an embodiment" does not necessarily mean only one embodiment, nor does multiple uses of the phrase necessarily refer to the same embodiment(s). It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention pertains in view of the present disclosure. It will be further understood that terms, such as those defined in commonly used dictionaries, should be interpreted as having a meaning that is consistent with their meaning in the context of the present disclosure and the relevant art and not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

Various embodiments of the present invention will be described in detail with reference to the accompanying drawings.

FIG. 1 is a block diagram illustrating a data processing system 100 in accordance with an embodiment of the present invention.

Referring to FIG. 1, the data processing system 100 may include a host 102 operatively coupled to a memory system 110.

The host 102 may include portable electronic devices such as a mobile phone, MP3 player, and laptop computer or non-portable electronic devices such as a desktop computer, game machine, TV and projector.

The host 102 may include at least one OS (operating system), and the OS may manage and control overall functions and operations of the host 102, and provide operation between the host 102 and a user of the data processing system 100 or the memory system 110. The OS may support functions and operations corresponding to the purpose and usage of a user. For example, the OS may be divided into a general OS and a mobile OS, depending on the mobility of the host 102. The general OS may be divided into a personal OS and an enterprise OS, depending on the environment of a user. For example, the personal OS configured to support a function of providing a service to general users may include Windows and Chrome, and the enterprise OS configured to secure and support high performance may include Windows server, Linux and Unix. Furthermore, the mobile OS configured to support a function of providing a mobile service to users and a system power saving function may include Android, iOS and Windows Mobile. The host 102 may include a plurality of OSs, and execute an OS to perform an operation corresponding to a user's request on the memory system 110.

The memory system 110 may store data for the host 102 in response to a request of the host 102. Examples of the memory system 110 may include, but are not limited to, a solid state drive (SSD), multi-media card (MMC), secure digital (SD) card, universal storage bus (USB) device, universal flash storage (UFS) device, compact flash (CF) card, smart media card (SMC), personal computer memory card international association (PCMCIA) card, and memory stick. The MMC may include an embedded MMC (eMMC), reduced size MMC (RS-MMC), and micro-MMC. The SD card may include a mini-SD card and micro-SD card.

The memory system 110 may be embodied by various types of storage devices. Non-limiting examples of storage devices included in the memory system 110 may include volatile memory devices such as a dynamic random access memory (DRAM) and a static RAM (SRAM) and nonvolatile memory devices such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), resistive RAM (RRAM) and a flash memory. The flash memory may have a 3-dimensional (3D) stack structure.

The memory system 110 may include a memory device 150 and a controller 130. The memory device 150 may store data for the host 102, and the controller 130 may control data storage into the memory device 150.

The controller 130 and the memory device 150 may be integrated into a single semiconductor device, which may be included in the various types of memory systems as exemplified above. For example, the controller 130 and the memory device 150 may be integrated as a single semiconductor device to constitute an SSD. When the memory system 110 is used as an SSD, the operating speed of the host 102 connected to the memory system 110 can be improved.

In addition, the controller 130 and the memory device 150 may be integrated as a single semiconductor device to constitute a memory card. For example, the controller 130 and the memory device 150 may constitute a memory card such as a personal computer memory card international association (PCMCIA) card, CF card, smart media card (SMC), memory stick, MMC including RS-MMC and micro-MMC, SD card including mini-SD, micro-SD and SDHC, or UFS device.

Non-limiting application examples of the memory system 110 may include a computer, an Ultra Mobile PC (UMPC), a workstation, a net-book, a Personal Digital Assistant (PDA), a portable computer, a web tablet, a tablet computer, a wireless phone, a mobile phone, a smart phone, an e-book, a Portable Multimedia Player (PMP), a portable game machine, a navigation system, a black box, a digital camera, a Digital Multimedia Broadcasting (DMB) player, a 3-dimensional television, a smart television, a digital audio recorder, a digital audio player, a digital picture recorder, a digital picture player, a digital video recorder, a digital video player, a storage device constituting a data center, a device capable of transmitting/receiving information in a wireless environment, one of various electronic devices constituting a home network, one of various electronic devices constituting a computer network, one of various electronic devices constituting a telematics network, a Radio Frequency Identification (RFID) device, or one of various components constituting a computing system.

The memory device 150 may be a nonvolatile memory device and may retain data stored therein even though power is not supplied. The memory device 150 may store data provided from the host 102 through a write operation, and provide data stored therein to the host 102 through a read operation. The memory device 150 may include a plurality of memory blocks 152 to 156, each of which may include a plurality of pages, and each of the pages may include a plurality of memory cells coupled to a word line. In an embodiment, the memory device 150 may be a flash memory. The flash memory may have a 3-dimensional (3D) stack structure.

The structure of the memory device 150 and the 3D stack structure of the memory device 150 will be described in detail later with reference to FIGS. 2 to 4, and the memory device 150 including a plurality of memory dies, each of which includes a plurality of planes, each of which includes a plurality of memory blocks 152 to 156 will be described in detail later with reference to FIG. 6. Thus, further description of such details is omitted immediately below.

The controller 130 may control the memory device 150 in response to a request from the host 102. For example, the controller 130 may provide data read from the memory device 150 to the host 102, and store data provided from the host 102 into the memory device 150. Thus, the controller 130 may control read, write, program and erase operations of the memory device 150.

The controller 130 may include a host interface (I/F) 132, a processor 134, an error correction code (ECC) 138, a Power Management Unit (PMU) 140, a memory interface 142 such as a NAND flash controller (NFC), and a memory 144 all operatively coupled via an internal bus.

The host interface 132 may be configured to process a command and data of the host 102, and may communicate with the host 102 through one or more of various interface protocols such as universal serial bus (USB), multi-media card (MMC), peripheral component interconnect-express (PCI-E), small computer system interface (SCSI), serial-attached SCSI (SAS), serial advanced technology attachment (SATA), parallel advanced technology attachment (PATA), enhanced small disk interface (ESDI) and integrated drive electronics (IDE).

The ECC 138 may detect and correct an error contained in the data read from the memory device 150. In other words, the ECC 138 may perform an error correction decoding process on the data read from the memory device 150 through an ECC code used during an ECC encoding process. According to a result of the error correction decoding process, the ECC 138 may output a signal, for example, an error correction success/fail signal. When the number of error bits is more than a threshold value of correctable error bits, the ECC 138 may not correct the error bits, and may output an error correction fail signal.

The ECC 138 may perform error correction through a coded modulation such as Low Density Parity Check (LDPC) code, Bose-Chaudhri-Hocquenghem (BCH) code, turbo code, Reed-Solomon code, convolution code, Recursive Systematic Code (RSC), Trellis-Coded Modulation (TCM) and Block coded modulation (BCM). However, embodiments of the present invention are not limited to such error correction techniques. Rather, ECC 138 may perform any suitable error correction technique. The ECC 138 may include all circuits, modules, systems or devices for error correction.

The PMU 140 may provide and manage power of the controller 130.

The memory interface 142 may serve as a memory/storage interface for interfacing the controller 130 and the memory device 150 such that the controller 130 controls the memory device 150 in response to a request from the host 102. When the memory device 150 is a flash memory or specifically a NAND flash memory, the memory interface 142 may generate a control signal for the memory device 150 and process data to be provided to the memory device 150 under the control of the processor 134. The memory interface 142 may work as an interface (e.g., a NAND flash interface) for processing a command and data between the controller 130 and the memory device 150. Specifically, the memory interface 142 may support data transfer between the controller 130 and the memory device 150.

The memory 144 may serve as a working memory of the memory system 110 and the controller 130, and store data for driving the memory system 110 and the controller 130. The controller 130 may control the memory device 150 to perform read, write, program, and erase operations in response to a request from the host 102. The controller 130 may provide data read from the memory device 150 to the host 102, may store data provided from the host 102 into the memory device 150. The memory 144 may store data required for the controller 130 and the memory device 150 to perform these operations.

The memory 144 may be embodied by a volatile memory. For example, the memory 144 may be embodied by static random access memory (SRAM) or dynamic random access memory (DRAM). The memory 144 may be disposed within or external to the controller 130. FIG. 1 shows an example of the memory 144 disposed within the controller 130. In an embodiment, the memory 144 may be embodied by an external volatile memory having a memory interface transferring data between the memory 144 and the controller 130.

The processor 134 may control the overall operations of the memory system 110. The processor 134 may drive firmware to control the overall operations of the memory system 110. The firmware may be referred to as flash translation layer (FTL). Also, the processor 134 may be realized as a microprocessor or a Central Processing Unit (CPU).

For example, the controller 130 may perform an operation requested by the host 102 in the memory device 150 through the processor 134, which is realized as a microprocessor or a CPU. In other words, the controller 130 may perform a command operation corresponding to a command received from the host 102. For example, the controller 130 may perform a foreground operation as the command operation corresponding to the command received from the host 102. To give more examples, the controller 130 may perform a program operation corresponding to a write command, a read operation corresponding to a read command, an erase operation corresponding to an erase command, and a parameter set operation corresponding to a set parameter command or a set feature command.

Also, the controller 130 may perform a background operation on the memory device 150 through the processor 134, which is realized as a microprocessor or a CPU. The background operation performed on the memory device 150 may include an operation of copying and processing data stored in some of memory blocks 152 to 156 into other such memory blocks, e.g., a garbage collection (GC) operation, an operation of performing swapping between the memory blocks 152 to 156 or between the data of the memory blocks 152 to 156, e.g., a wear-leveling (WL) operation, an operation of storing the map data stored in the controller 130 in the memory blocks 152 to 156, e.g., a map flush operation, or an operation of managing bad blocks of the memory device 150, e.g., a bad block management operation of detecting and processing bad blocks among the memory blocks 152 to 156.

Also, in the memory system in accordance with an embodiment of the present invention, the controller 130 may perform on the memory device 150 a plurality of command operations corresponding to a plurality of commands received from the host 102, e.g., a plurality of program operations corresponding to a plurality of write commands, a plurality of read operations corresponding to a plurality of read commands, and a plurality of erase operations corresponding to a plurality of erase commands, and update metadata, particularly, map data, according to the performance of the command operations.

In the memory system in accordance with an embodiment of the present invention, as the controller 130 continues to perform command operations corresponding to commands received from the host 102, e.g., program operations, read operations, and erase operations, in the memory blocks, such operations may deteriorate the reliability of the memory device 150, which in turn may decrease the utility efficiency of the memory device 150. Therefore, a copy operation or a swap operation may be performed in the memory device 150 in consideration of the parameters for the memory device 150 based on the performance of the command operations.

For example, in the memory system in accordance with an embodiment of the present invention, when the controller 130 performs program operations corresponding to a plurality of write commands received from the host 102 in the memory blocks, the controller 130 may perform a copy operation, e.g., a garbage collection operation, on the memory device 150 in order to improve the utility efficiency of the memory device 150.

Also, in the memory system in accordance with an embodiment of the present invention, each of the memory blocks in the memory device 150 may have a limited erase count. Thus, when the controller 130 performs erase operations in the memory blocks corresponding to a plurality of erase commands received from the host 102, the controller 130 may perform such erase operations within range of the limited erase count. For example, when the controller 130 performs erase operations on particular memory blocks exceeding the limited erase count, the particular memory blocks may processed as bad blocks, which may not be used any more. The limited erase count for the memory blocks of the memory device 150 may represent the maximum number of erase operations that may be performed on the memory blocks. Therefore, in the memory system in accordance with an embodiment of the present invention, erase operations may be performed uniformly within the range of the limited erase count for the memory blocks of the memory device 150. Also, in order to maintain operational reliability of the memory blocks of the memory device 150 as a result of the erase operations, data may be processed with the memory blocks of the memory device 150 in consideration of the parameters of the memory blocks of the memory device 150, for example, a swap operation, e.g., a wear-leveling operation, may be performed in the memory device 150.

Also, in the memory system in accordance with an embodiment of the present invention, when the controller 130 performs read operations corresponding to a plurality of read commands received from the host 102 in the memory blocks, particularly, when the controller 130 repeatedly performs read operations in some particular memory blocks, read disturbance may be caused in the particular memory blocks due to the repeated read operations. Therefore, the controller 130 may perform a read reclaim operation to protect the particular memory blocks from losing data due to the read disturbance. In other words, in the memory system in accordance with an embodiment of the present invention, the controller 130 may copy and store the data in the particular memory blocks into other memory blocks through the read reclaim operation. In short, the controller 130 may perform a copy operation for the particular memory blocks in the memory device 150.

In the memory system in accordance with an embodiment of the present invention, the controller 130 may perform not only a swap operation and a copy operation but also a bad block management operation for some memory blocks in consideration of the parameters according to the performance of command operations, e.g., valid page counts (VPC) of the memory blocks according to the performance of program operations, erase counts according to the performance of erase operations, program counts according to the performance of program operations, and read counts according to the performance of read operations. Also, in the memory system in accordance with an embodiment of the present invention, the controller 130 may perform a copy operation, e.g., a garbage collection operation, on the memory blocks in consideration of the parameters corresponding to not only the swap operation and the copy operation but also the bad block management operation that are performed in the memory blocks. The performance of the command operations and the performance of the swap operation and the copy operation performed in the memory device 150 in consideration of the parameters corresponding to the performance of such operations will be described in detail later with reference to FIGS. 5 to 9.

The processor 134 of the controller 130 may include a management unit (not illustrated) for performing a bad management operation of the memory device 150. The management unit may perform a bad block management operation of checking a bad memory block, in which a program fail occurs due to a characteristic of the memory device, for example, a NAND flash memory during a program operation. The management unit may write the program-failed data of the bad block to a new memory block. In a memory device 150 having a 3D stack structure, the bad block management operation may reduce the use efficiency of the memory device 150 and the reliability of the memory system 110. Thus, the bad block management operation should be performed with more reliability.

Figure 2:
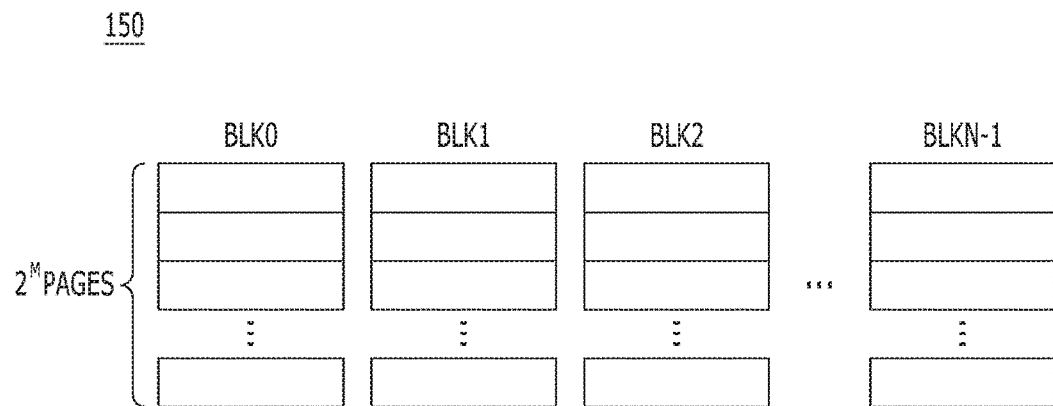
FIG. 2 is a schematic diagram illustrating an exemplary configuration of a memory device employed in a memory system of FIG. 1.
Figure 3:
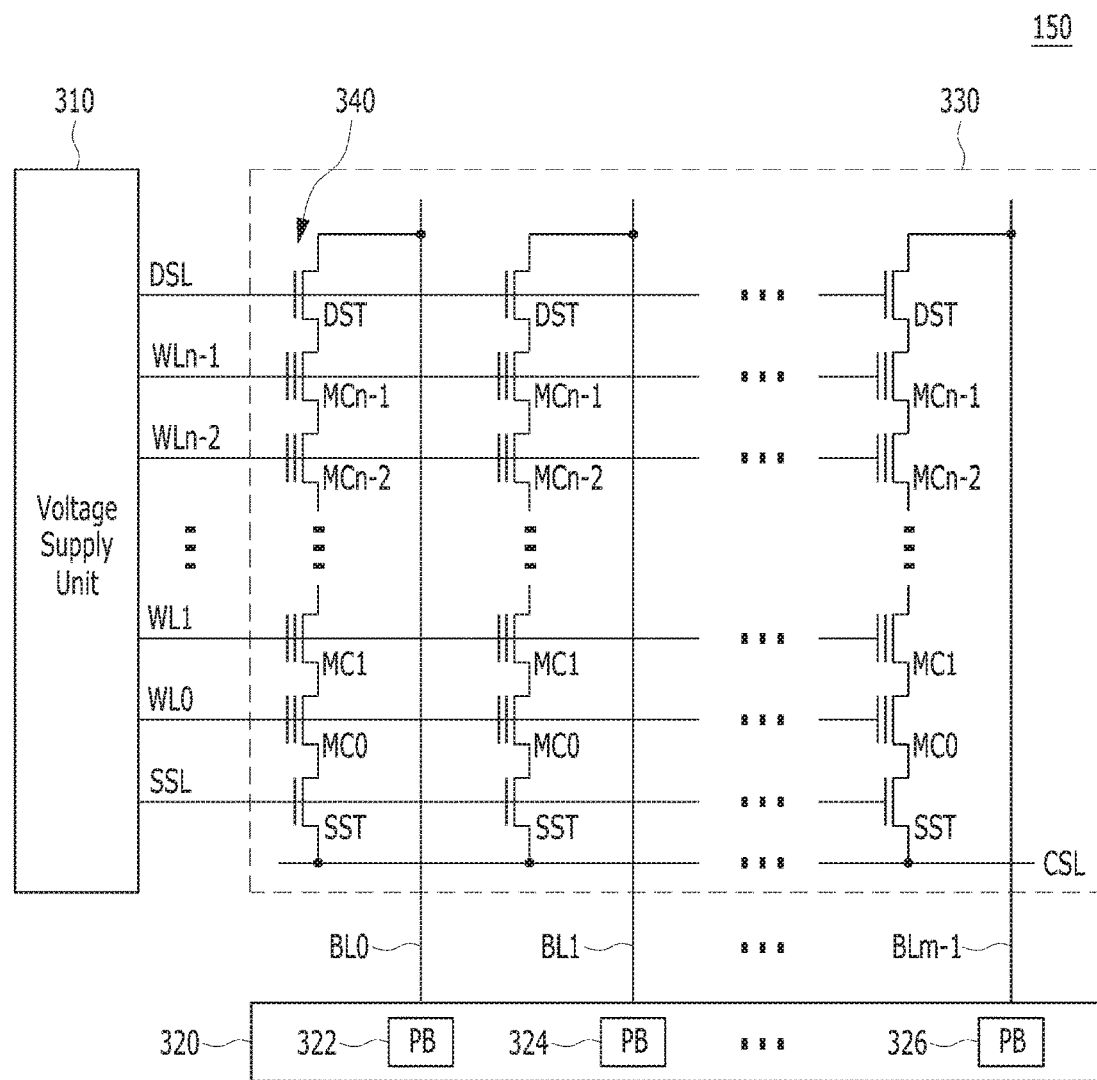
FIG. 3 is a circuit diagram illustrating an exemplary configuration of a memory cell array of a memory block in a memory device shown in FIG. 1.
Figure 4:
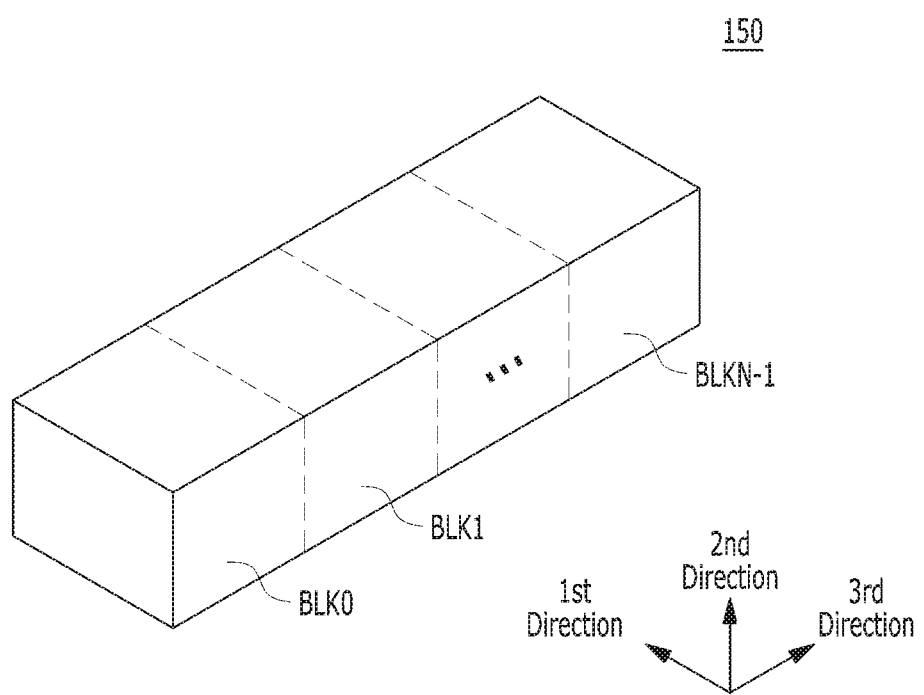
FIG. 4 is a block diagram illustrating a data processing system in accordance with an embodiment of the present invention.

FIG. 2 is a schematic diagram illustrating an exemplary configuration of the memory device 150, FIG. 3 is a circuit diagram illustrating an exemplary configuration of a memory cell array of a memory block in the memory device 150, and FIG. 4 is a schematic diagram illustrating an exemplary 3D structure of the memory device 150.

Referring to FIG. 2, the memory device 150 may include a plurality of memory blocks BLK0 to BLKN−1, e.g., a memory block 0 BLK0, a memory block 1 BLK1, a memory block 2 BLK2, and a memory block N−1 BLKN−1, and each of the memory blocks BLK0 to BLKN−1 may include a plurality of pages, for example, $2^M$ pages, the number of which may vary according to circuit design. Each of the memory blocks in FIG. 2 includes $2^M$ pages. However, each of the memory blocks may include a different number of pages, e.g., M pages. Each of the pages may include a plurality of memory cells that are coupled to a plurality of word lines WL.

Also, the memory device 150 may include a plurality of memory blocks, which may include a single level cell (SLC) memory block storing 1-bit data and/or a multi-level cell (MLC) memory block storing 2-bit data. The SLC memory blocks may include a plurality of pages that are realized by memory cells storing one-bit data in one memory cell. The SLC memory blocks may have a quick data operation performance and high durability. In another arrangement, the MLC memory blocks may include a plurality of pages that are realized by memory cells storing multi-bit data, e.g., data of two or more bits, in one memory cell. The MLC memory blocks may have a greater data storing space than the SLC memory blocks. In other words, the MLC memory blocks may be highly integrated. Particularly, the memory device 150 may include not only the MLC memory blocks each of which includes a plurality of pages that are realized by memory cells capable of storing two-bit data in one memory cell, but also triple level cell (TLC) memory blocks each of which includes a plurality of pages that are realized by memory cells capable of storing three-bit data in one memory cell, quadruple level cell (QLC) memory blocks each of which includes a plurality of pages that are realized by memory cells capable of storing four-bit data in one memory cell, and/or multiple level cell memory blocks each of which includes a plurality of pages that are realized by memory cells capable of storing five or more-bit data in one memory cell, and the like.

For convenience, the memory device 150 is described in various embodiments as a non-volatile memory, such as a flash memory, e.g., a NAND flash memory. However, the invention is not so limited. Rather, the memory device 150 may be realized in other configurations, such as a Phase Change Random Access Memory (PCRAM), a Resistive Random Access Memory (RRAM or ReRAM), a Ferroelectric Random Access Memory (FRAM), a Spin Transfer Torque Magnetic Random Access Memory (STT-RAM or STT-MRAM).

The memory blocks BLK0 to BLKN−1 may store the data transferred from the host 102 through a program operation, and transfer data stored therein to the host 102 through a read operation.

Subsequently, referring to FIG. 3, a memory block 330 which may correspond to any of the plurality of memory blocks 152 to 156 included in the memory device 150 of the memory system 110 may include a plurality of cell strings 340 coupled to a plurality of corresponding bit lines BL0 to BLm−1. The cell string 340 of each column may include one or more drain select transistors DST and one or more source select transistors SST. Between the drain and select transistors DST and SST, a plurality of memory cells MC0 to MCn−1 may be coupled in series. In an embodiment, each of the memory cell transistors MC0 to MCn−1 may be embodied by an MLC capable of storing data information of a plurality of bits. Each of the cell strings 340 may be electrically coupled to a corresponding bit line among the plurality of bit lines BL0 to BLm−1. For example, as illustrated in FIG. 3, the first cell string is coupled to the first bit line BL0, and the last cell string is coupled to the last bit line BLm−1.

Although FIG. 3 illustrates NAND flash memory cells, the invention is not limited in this way. It is noted that the memory cells may be NOR flash memory cells, or hybrid flash memory cells including two or more types of memory cells combined therein. Also, it is noted that the memory device 150 may be a flash memory device including a conductive floating gate as a charge storage layer or a charge trap flash (CTF) memory device including an insulation layer as a charge storage layer.

The memory device 150 may further include a voltage supply unit 310 which provides word line voltages including a program voltage, a read voltage, and a pass voltage to supply to the word lines according to an operation mode. The voltage generation operation of the voltage supply unit 310 may be controlled by a control circuit (not illustrated). Under the control of the control circuit, the voltage supply unit 310 may select one of the memory blocks (or sectors) of the memory cell array, select one of the word lines of the selected memory block, and provide the word line voltages to the selected word line and the unselected word lines.

The memory device 150 may include a read/write circuit 320 which is controlled by the control circuit. During a verification/normal read operation, the read/write circuit 320 may operate as a sense amplifier for reading data from the memory cell array. During a program operation, the read/write circuit 320 may operate as a write driver for driving bit lines according to data to be stored in the memory cell array. During a program operation, the read/write circuit 320 may receive from a buffer (not illustrated) data to be stored into the memory cell array, and drive bit lines according to the received data. The read/write circuit 320 may include a plurality of page buffers 322 to 326 respectively corresponding to columns (or bit lines) or column pairs (or bit line pairs), and each of the page buffers 322 to 326 may include a plurality of latches (not illustrated).

The memory device 150 may be embodied by a 2D or 3D memory device. Particularly, as illustrated in FIG. 4, the memory device 150 may be embodied by a nonvolatile memory device having a 3D stack structure. When the memory device 150 has a 3D structure, the memory device 150 may include a plurality of memory blocks BLK0 to BLKN−1. FIG. 4 is a block diagram illustrating the memory blocks 152 to 156 of the memory device 150 shown in FIG. 1. Each of the memory blocks 152 to 156 may be realized in a 3D structure (or vertical structure). For example, the memory blocks 152 to 156 may be three-dimensional structures with dimensions that extend in first to third directions, e.g., an x-axis direction, a y-axis direction, and a z-axis direction.

Each memory block 330 in the memory device 150 may include a plurality of NAND strings NS that extend in each of the first, second and third directions. Each of the NAND strings NS may be coupled to a bit line BL, at least one source selection line SSL, at least one drain selection line DSL, a plurality of word lines WL, at least one dummy word line DWL, and a common source line CSL. Each of the NAND strings NS may include a plurality of transistor structures TS.

In short, each memory block 330 among the memory blocks 152 to 156 of the memory device 150 may be coupled to a plurality of bit lines BL, a plurality of source selection lines SSL, a plurality of drain selection lines DSL, a plurality of word lines WL, a plurality of dummy word lines DWL, and a plurality of common source lines CSL, and each memory block 330 may include a plurality of NAND strings NS. Also, in each memory block 330, one bit line BL may be coupled to a plurality of NAND strings NS to realize a plurality of transistors in one NAND string NS. Also, a string selection transistor SST of each NAND string NS may be coupled to a corresponding bit line BL, and a ground selection transistor GST of each NAND string NS may be coupled to a common source line CSL. Memory cells MC may be provided between the string selection transistor SST and the ground selection transistor GST of each NAND string NS. In other words, a plurality of memory cells may be realized in each memory block 330 of the memory blocks 152 to 156 of the memory device 150. An exemplary data processing operation in accordance with an embodiment of the present invention is described in detail with reference to FIGS. 5 to 9.

FIGS. 5 to 8 illustrate an example of a data processing operation in which a plurality of command operations corresponding to a plurality of commands are performed in a memory system. For sake of convenience, such processing is described in the context of which a plurality of commands are received from the host 102 and command operations corresponding to the received commands are performed in the memory system 110 of FIG. 1. For example, a plurality of write commands may be received from the host 102 and program operations corresponding to the write commands may be performed, or a plurality of read commands may be received from the host 102 and read operations corresponding to the read commands may be performed, or a plurality of erase commands may be received from the host 102 and erase operations corresponding to the erase commands may be performed, or a plurality of write commands and a plurality of read commands may be received together from the host 102 and program operations and read operations corresponding to the write commands and the read commands may be performed.

In another example, write data corresponding to a plurality of write commands received from the host 102 are stored in a buffer/cache in the memory 144 of the controller 130, and then the data stored in the buffer/cache are programmed and stored in a plurality of memory blocks in the memory device 150 (in short, program operations are performed), and also map data are updated corresponding to the program operations into the memory device 150 and then the updated map data are stored in the memory blocks. In short, program operations corresponding to a plurality of write commands received from the host 102 are performed in this example.

In still another example, a plurality of read commands are received from the host 102 for the data stored in the memory device 150, the data corresponding to the read commands are read from the memory device 150 by detecting the map data for the data corresponding to the read commands and the read data are stored in the buffer/cache included in the memory 144 of the controller 130 and the data stored in the buffer/cache are transferred to the host 102. In short, read operations corresponding to the read commands received from the host 102 are performed in this example.

In yet another example, a plurality of erase commands are received from the host 102 for the memory blocks included in the memory device 150, the memory blocks corresponding to the erase commands are detected and the data stored in the detected memory blocks are erased and the map data are updated corresponding to the erased data and the updated map data are stored in the memory blocks. In short, erase operations corresponding to the erase commands received from the host 102 are performed in this example.

For sake of convenience, the command operations performed in the memory system 110 are described as being performed by the controller 130. However, this is merely an example and, as described above, the processor 134 in the controller 130, e.g., the FTL, may perform the command operations.

Also, in this embodiment of the present invention, the controller 130 may program and store the user data corresponding to the write commands received from the host 102 and the metadata in some memory blocks, read the user data corresponding to the read commands received from the host 102 and the metadata from the memory blocks, and transfer the read user data and the metadata to the host 102, or erase the user data corresponding to the erase commands received from the host 102 and metadata from the memory blocks.

The metadata may include first map data including Logical to Physical (L2P) information (hereafter, referred to as 'logical information') for the data stored in memory blocks through a program operation, and second map data including Physical to Logical (P2L) information (hereafter referred to as 'physical information'). Also, the metadata may include information on the command data corresponding to a command received from the host 102, information on a command operation corresponding to the command, information on the memory blocks of the memory device 150 where the command operation is performed, and information on the map data corresponding to the command operation. In other words, the metadata may include all the other information and data except the user data corresponding to a command received from the host 102.

According to an embodiment of the present invention, the controller 130 may perform command operations corresponding to a plurality of commands received from the host 102. For example, when the controller 130 receives write commands from the host 102, the controller 130 may perform program operations corresponding to the write commands. The controller 130 may program and store user data corresponding to the write commands in the memory blocks of the memory device 150, such as empty memory blocks where an erase operation is performed, open memory blocks, or free memory blocks. Also, the controller 130 may program and store mapping information between the logical addresses and the physical addresses for the user data stored in the memory blocks (which are first map data including an L2P map table or an L2P map list containing logical information) and mapping information between the physical addresses and the logical addresses for the memory blocks storing the user data (which are second map data including a P2L map table or a P2L map list containing physical information) in the empty memory blocks, open memory blocks, or free memory blocks among the memory blocks in the memory device 150.

When the controller 130 receives write commands from the host 102, the controller 130 may program and store user data corresponding to the write commands in the memory blocks and store metadata that includes the first map data and the second map data for the stored user data in memory blocks. Particularly, since data segments of the user data are stored in the memory blocks, the controller 130 may generate and update meta segments of the metadata, which are map segments of map data including L2P segments of the first map data and P2L segments of the second map data, and store them in the memory blocks of the memory device 150. Herein, the map segments stored in the memory blocks may be loaded in the memory 144 of the controller 130 to be updated.

Also, when the controller 130 receives a plurality of read commands from the host 102, the controller 130 may read out the read data corresponding to the read commands from the memory device 150, store the read data in the buffer/cache included in the memory 144 of the controller 130, transfer the data stored in the buffer/cache to the host 102. In this way, read operations corresponding to the read commands may be performed.

Also, when the controller 130 receives a plurality of erase commands from the host 102, the controller 130 may detect memory blocks of the memory device 150 that correspond to the erase commands and perform erase operations on the detected memory blocks. A data processing operation performed in the memory system in accordance with embodiments of the present invention is described in detail with reference to FIGS. 5 to 8.

Figure 5:
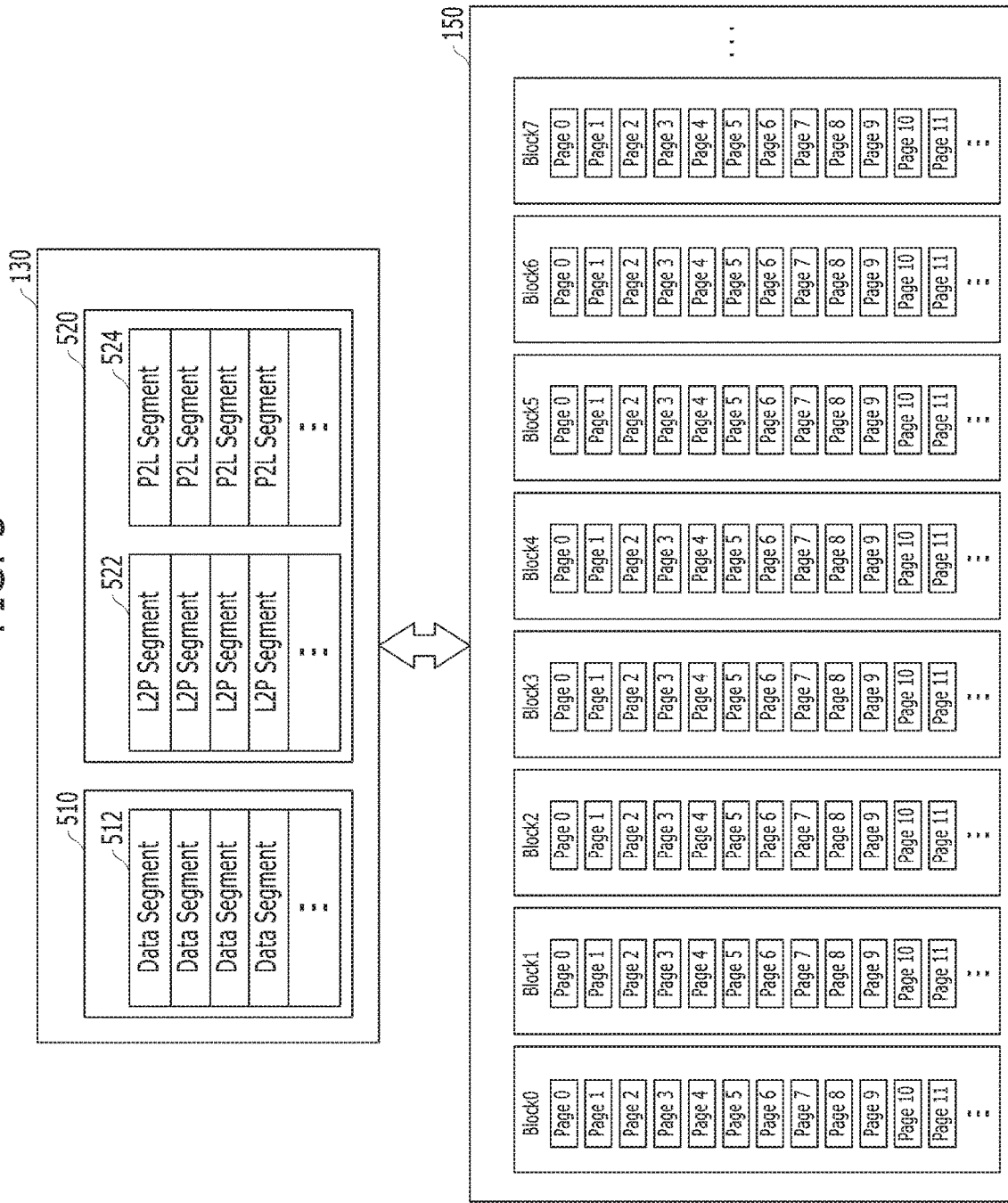
FIGS. 5 to 8 illustrate an example of a data processing operation when a plurality of command operations corresponding to a plurality of commands are performed in a memory system in accordance with an embodiment of the present invention.

Referring to FIG. 5, the controller 130 may perform command operations corresponding to a plurality of commands received from the host 102. For example, the controller 130 may perform program operations corresponding to a plurality of write commands received from the host 102. The controller 130 may program and store user data corresponding to the write commands in memory blocks of the memory device 150, and generate and update metadata for the user data when the program operation is performed on the memory blocks, and then store the generated and updated metadata in the memory blocks of the memory device 150.

The controller 130 may generate and update first map data and second map data which include information representing that the user data are stored in the pages in the memory blocks of the memory device 150. In other words, the controller 130 may generate and update logical segments of the first map data, which include L2P segments, and physical segments of the second map data, which include P2L segments, and store the generated and updated logical segments in the pages in the memory blocks of the memory device 150.

For example, the controller 130 may cache and buffer the user data corresponding to the write commands received from the host 102 in the first buffer 510 in the memory 144 of the controller 130. In other words, the controller 130 may store the data segments 512 of the user data in the first buffer 510, which is a data buffer/cache, and store the data segments 512 stored in the first buffer 510 in the pages in the memory blocks of the memory device 150. Since the data segments 512 of the user data corresponding to the write commands received from the host 102 are programmed and stored in the pages in the memory blocks of the memory device 150, the controller 130 may generate and update the first map data and the second map data and store them in the second buffer 520 in the memory 144 of the controller 130. In short, the controller 130 may store the L2P segments 522 of the first map data and the P2L segments 524 of the second map data for the user data in the second buffer 520, which is a map buffer/cache. As described above, the L2P segments 522 of the first map data and the P2L segments 524 of the second map data or a map list for the L2P segments 522 of the first map data and a map list for the P2L segments 524 of the second map data may be stored in the second buffer 520 in the memory 144 of the controller 130. Also, the controller 130 may store the L2P segments 522 of the first map data and the P2L segments 524 of the second map data that are stored in the second buffer 520 in the pages stored in the memory blocks of the memory device 150.

Also, the controller 130 may perform command operations corresponding to a plurality of commands received from the host 102. For example, the controller 130 may perform read operations corresponding to a plurality of read commands received from the host 102. The controller 130 may load and check out the map segments of the map data for the user data corresponding to the read commands, e.g., the L2P segments 522 of the first map data and the P2L segments 524 of the second map data, on the second buffer 520, and then read the user data stored in the pages of the corresponding memory blocks, store the data segments 512 of the read user data in the first buffer 510, and transfer them to the host 102.

In addition, the controller 130 may perform command operations corresponding to a plurality of commands received from the host 102. In other words, the controller 130 may perform erase operations corresponding to a plurality of erase commands received from the host 102. The controller 130 may detect memory blocks corresponding to the erase commands among the memory blocks of the memory device 150, and perform the erase operations on the detected memory blocks.

When a background operation, for example, an operation of copying data or swapping data from the memory blocks in the memory device 150, such as a garbage collection operation or a wear-leveling operation, is performed, the controller 130 may store the data segments 512 of the corresponding user data in the first buffer 510, load the map segments 522 and 524 of the map data corresponding to the user data onto the second buffer 520, and perform the garbage collection operation or the wear-leveling operation.

As described above, when performing the command operations on the memory blocks of the memory device 150, the controller 130 may detect performance results of the command operations. In other words, the controller 130 may detect memory blocks where failure of the command operations occurs among the memory blocks. The controller 130 may detect each of the memory blocks where the failure of the command operations occurs as a bad block, and perform a bad block management operation on each of the memory blocks where the failure of the command operations occurs. The controller 130 may detect memory blocks where program failure of the program operations occurs or read failure of the read operations occurs among the memory blocks of the memory device 150, and perform the bad block management operation on each of the memory blocks where the program failure or the read failure occurs.

Figure 6:
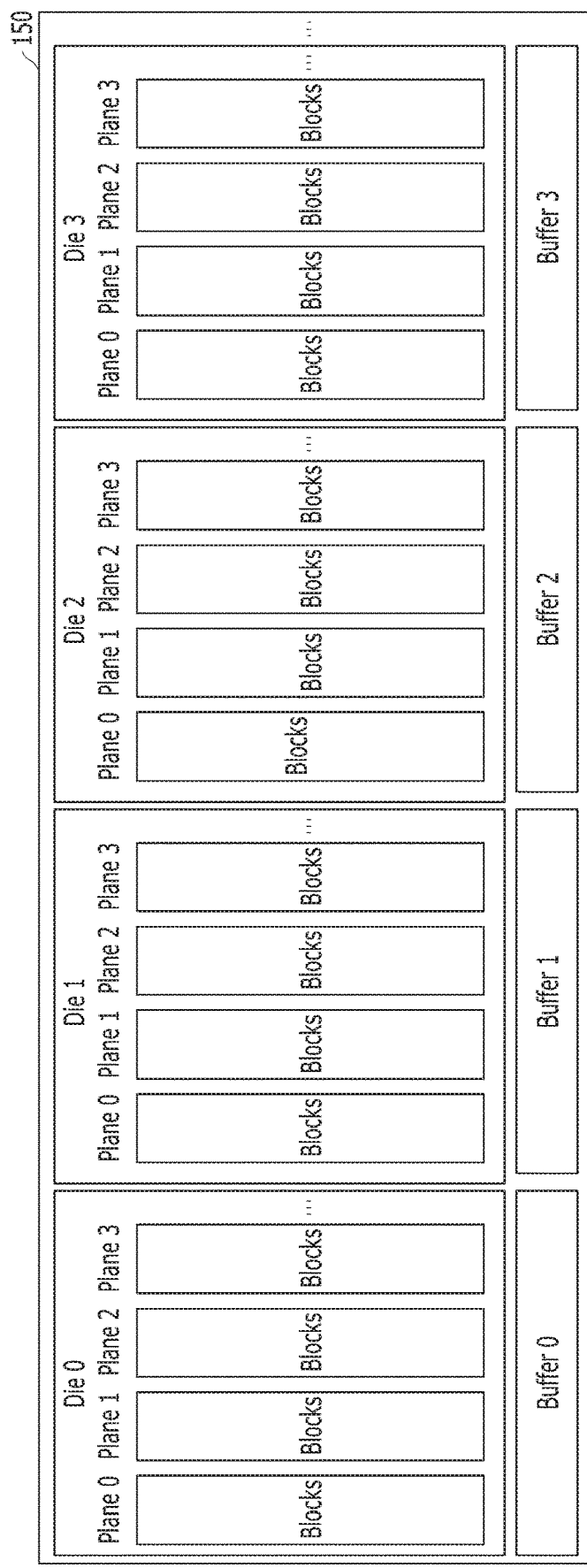

Referring to FIG. 6, the memory device 150 may include a plurality of memory dies, e.g., a memory die 0, a memory die 1, a memory die 2, and a memory die 3. Each of the memory dies may include a plurality of planes, e.g., a plane 0, a plane 1, a plane 2, and a plane 3. Each of the planes of the memory dies in the memory device 150 may include a plurality of memory blocks. For example, as described earlier with reference to FIG. 2, each of the planes may include N blocks BLK0, BLK1, ..., BLKN−1 including a plurality of pages, e.g., $2^M$ pages. The memory device 150 may include a plurality of buffers that respectively correspond to the memory dies. For example, the memory device 150 may include a buffer 0 corresponding to the memory die 0, a buffer 1 corresponding to the memory die 1, a buffer 2 corresponding to the memory die 2, and a buffer 3 corresponding to the memory die 3.

When the command operations corresponding to the plurality of commands received from the host 102 are performed, data corresponding to the command operations may be stored in the buffers in the memory device 150. For example, when the program operations are performed, data corresponding to the program operations may be stored in the buffers, and then stored in the pages in the memory blocks of the memory dies. When read operations are performed, data corresponding to the read operations may be read from the pages in the memory blocks of the memory dies, stored in the buffers, and transferred to the host 102 through the controller 130.

In the embodiment illustrated in FIG. 6, the buffers in the memory device 150 are located outside of the corresponding memory dies. However, the buffers in the memory device 150 may be inside of the corresponding memory dies. Also, the buffers may correspond to the planes or the memory blocks in the memory dies. Moreover, for the sake of convenience, the buffers in the memory device 150 are described as a plurality of page buffers with reference to FIG. 3. However, the buffers may be a plurality of caches or a plurality of registers included in the memory device 150.

Also, the memory blocks included in the memory device 150 may be grouped into a plurality of super memory blocks, and then the command operations may be performed on the super memory blocks. Each of the super memory blocks may include a plurality of memory blocks, for example, memory blocks included in a first memory block group and a second memory block group. When the first memory block group is included in a first plane of a first memory die, the second memory block group may be included in the first plane of the first memory die, a second plane of the first memory die, or planes of a second memory die. As described earlier, when the command operations corresponding to the commands received from the host 102 are performed on the memory blocks in the memory device 150, the performance results of the command operations may be detected, and then the bad block management operation may be performed on the memory blocks based on the performance results of the command operations. Detailed description of operations are provided with reference to FIGS. 7 and 8.

Figure 7:
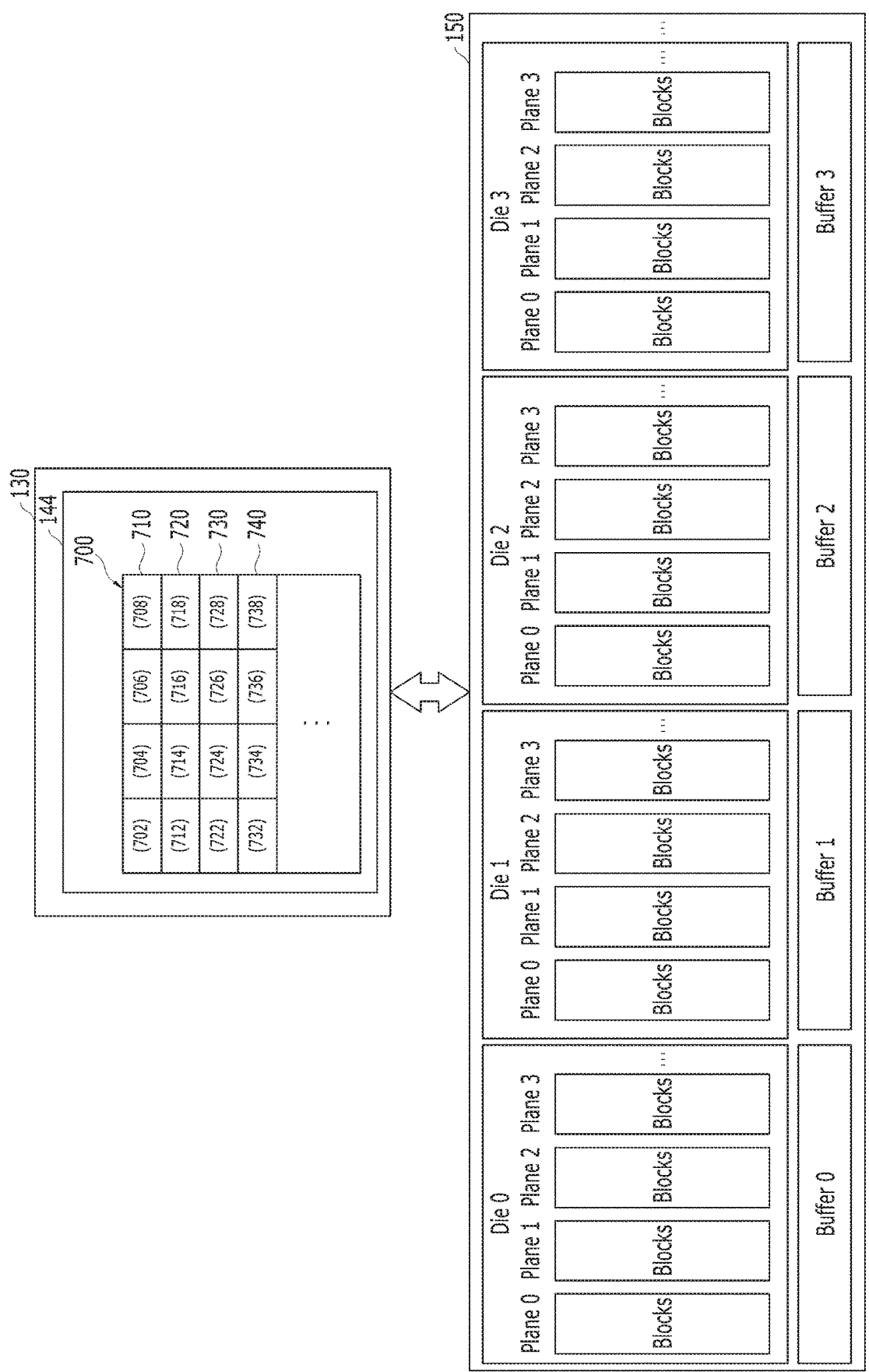

Referring to FIG. 7, when the controller 130 receives a plurality of commands, e.g., a plurality of write commands, a plurality of read commands, and a plurality of erase commands from the host 102, the controller 130 may perform command operations corresponding to the commands received from the host 102, e.g., program operations, read operations, and erase operations, on a plurality of memory blocks in the memory device 150. The controller 130 may detect performance results of the command operations performed on the memory blocks, and detect bad blocks among the memory blocks based on the performance results of the command operations. Particularly, the controller 130 may detect memory blocks where failure occurs as the bad blocks. In addition, the controller 130 may perform a bad block management operation on each of the memory blocks which are detected as the bad blocks.

More specifically, the controller 130 may perform the program operations corresponding to the write commands received from the host 102 on the memory blocks. The controller 130 may detect performance results of the program operations performed on the memory blocks, and detect memory blocks where failure occurs among the memory blocks. The controller 130 may detect each of the memory blocks where failure occurs as the bad block, and record information representing the bad block in a list 700, which may be in form of a bitmap. In other words, the controller 130 may record the information representing the memory blocks where failure occurs as the bad blocks in the list 700, and store the list 700 where the information representing the bad blocks is recorded in the memory 144 of the controller 130. The controller 130 may include the list 700 stored in the memory 144 in metadata, and store the list 700 included in the metadata in the memory device 150.

The controller 130 may perform the read operations corresponding to the read commands received from the host 102 on the memory blocks in the memory device 150. The controller 130 may detect performance results of the read operations performed on the memory blocks, and detect memory blocks where failure occurs among the memory blocks. The memory blocks where failure occurs may be memory blocks where error code correction failure or error code correction decoding failure occurs. The controller 130 may detect each of the memory blocks where failure occurs as the bad block, and record information representing the bad block in the list 700. In other words, the controller 130 may record the information representing the memory blocks where failure occurs as the bad blocks in the list 700, and store the list 700 where the information representing the bad blocks is recorded in the memory 144 of the controller 130. The controller 130 may include the list 700 stored in the memory 144 in metadata, and store the list 700 included in the metadata in the memory device 150.

The controller 130 may record the information representing the bad block among the memory blocks in each of the memory dies in the memory device 150 in bit regions of respective rows of the list 700. Each of the rows of the list 700 may correspond to each of the memory dies in the memory device 150, and the bit regions included in each of the rows of the list 700 may correspond to each of the planes in each of the memory dies. For example, the controller 130 may record information representing a bad block among the memory blocks in the memory die 0 in a first row 710 of the list 700, record information representing a bad block among the memory blocks included in the memory die 1 in a second row 720 of the list 700, record information representing a bad block among the memory blocks included in the memory die 2 in a third row 730 of the list 700, and record information representing a bad block among the memory blocks included in the memory die 3 in a fourth row 740 of the list 700.

In addition, the controller 130 may record the information representing the bad block among the memory blocks included in each of the planes in the bit regions of the respective rows 710, 720, 730 and 740 of the list 700. The controller 130 may record information representing a bad block among the memory blocks in the plane 0 in the memory die 0 of the memory device 150 in a first bit region 702 of the first row 710 of the list 700, record information representing a bad block among the memory blocks in the plane 1 in the memory die 0 of the memory device 150 in a second bit region 704 of the first row 710 of the list 700, record information representing a bad block among the memory blocks in the plane 2 in the memory die 0 of the memory device 150 in a third bit region 706 of the first row 710 of the list 700, and record information representing a bad block among the memory blocks in the plane 3 in the memory die 0 of the memory device 150 in a fourth bit region 708 of the first row 710 of the list 700.

The controller 130 may record information representing a bad block among the memory blocks included in the plane 0 in the memory die 1 of memory device 150 in a first bit region 712 of the second row 720 of the list 700, record information representing a bad block among the memory blocks in the plane 1 in the memory die 1 of the memory device 150 in a second bit region 714 of the second row 720 of the list 700, record information representing a bad block among the memory blocks in the plane 2 included in the memory die 1 of the memory device 150 in a third bit region 716 of the second row 720 of the list 700, and record information representing a bad block among the memory blocks in the plane 3 in the memory die 1 of the memory device 150 in a fourth bit region 718 of the second row 720 of the list 700.

The controller 130 may record information representing a bad block among the memory blocks in the plane 0 included in the memory die 2 of the memory device 150 in a first bit region 722 of the third row 730 of the list 700, record information representing a bad block among the memory blocks in the plane 1 in the memory die 2 of the memory device 150 in a second bit region 724 of the third row 730 of the list 700, record information representing a bad block among the memory blocks in the plane 2 in the memory die 2 of the memory device 150 in a third bit region 726 of the third row 730 of the list 700, and record information representing a bad block among the memory blocks in the plane 3 in the memory die 2 of the memory device 150 in a fourth bit region 728 of the third row 730 of the list 700.

The controller 130 may record information representing a bad block among the memory blocks in the plane 0 included in the memory die 3 of the memory device 150 in a first bit region 732 of the fourth row 740 of the list 700, record information representing a bad block among the memory blocks in the plane 1 included in the memory die 3 of the memory device 150 in a second bit region 734 of the fourth row 740 of the list 700, record information representing a bad block among the memory blocks in the plane 2 in the memory die 3 of the memory device 150 in a third bit region 736 of the fourth row 740 of the list 700, and record information representing a bad block among the memory blocks in the plane 3 in the memory die 3 of the memory device 150 in a fourth bit region 738 of the fourth row 740 of the list 700.

As described above, the controller 130 may record the information representing the bad blocks among the memory blocks of the memory device 150 in the list 700, and then update the list 700 based on the performance of the command operations when a bad block is additionally detected from the memory blocks in the memory device 150. In other words, the controller 130 may record information representing the bad block which is additionally detected from the memory blocks in the memory device 150 in the bit region of a corresponding row of the list 700, thereby updating the list 700. When updating the list 700, the controller 130 may update the list 700 through a mathematical operation, e.g., an OR operation, in the bit regions of the respective rows of the list 700.

The controller 130 may process each of the memory blocks. In doing so, information representing bad blocks are recorded in the list 700, and each such block is considered as a closed memory block. In other words, the controller 130 may process each of the memory blocks where program failure or read failure occurs among the memory blocks of the memory device 150 as the closed memory block, and thus may not perform any additional program operation in the closed memory block. The controller 130 may not perform the program operation in the closed memory block even though there are empty pages, open pages, or free pages in which data are not stored in the closed memory block.

The controller 130 may select the bad block as a source memory block or a victim memory block by referring to the information recorded in the list 700, and copy and store valid data stored in the source memory block in a target memory block. The source memory block may be the memory blocks where the program failure or the read failure occurs, and the target memory block may be empty memory blocks, open memory blocks, or free memory blocks on which the erase operation is normally performed. The valid data stored in the memory blocks where the program failure or the read failure occurs may be data normally stored in the pages of the memory blocks where the program failure or the read failure occurs. For example, first pages where program success occurs, second pages where program failure occurs, and open pages may be included in the pages included in the memory blocks where the program failure occurs. Data stored in the first pages where the program success occurs may be the valid data in the memory blocks where the program failure occurs. Third pages where read success occurs and four pages where read failure occurs may be included in the pages included in the memory blocks where the read failure occurs. Open pages may be also included in the pages in the memory blocks where the read failure occurs. Data stored in the third pages where the read success occurs may be the valid data in the memory blocks where the read failure occurs. The first pages where the program success occurs and the third pages where the read success occurs may be valid pages in the memory blocks where the program failure or the read failure occurs.

The controller 130 may allocate queuing modules in the memory 144 of the controller 130 to copy and store the valid data stored in the memory blocks where the program failure or the read failure occurs as the target memory block. In other words, the controller 130 may store the valid data in the memory blocks where the program failure or the read failure occurs in the queuing modules, and subsequently store the valid data in the queuing modules in pages of the target memory block. The controller 130 may process the memory blocks where the program failure or the read failure occurs as the bad blocks, and perform the bad block management operation thereon. It is described below in detail with reference to FIG. 8 that the controller 130 performs the bad block management operation based on the information representing the bad block among the memory blocks of the memory device 150, which is recorded in the list 700.

Figure 8:
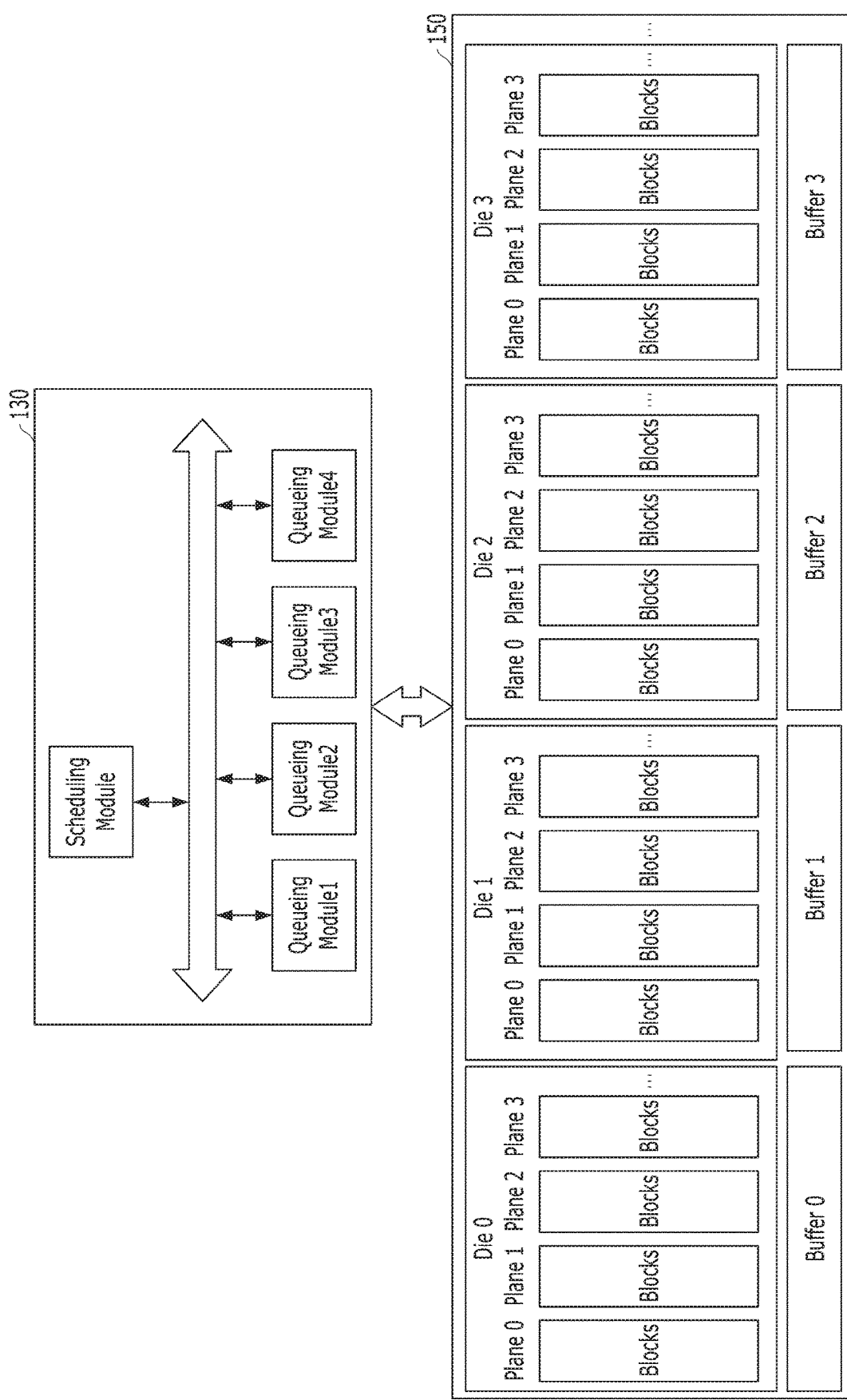

Referring to FIG. 8, the controller 130 may schedule queues in the memory 144 of the controller 130 through a scheduling module to perform the bad block management operation on the memory blocks where the program failure or the read failure occurs among the memory blocks of the memory device 150 based on the bad block information recorded in the list 700. Consequently, the controller 130 may allocate the queueing modules to the memory 144 of the controller 130.

The scheduling module may schedule the queues through the processor 134 of the controller 130, particularly, the FTL. Also, when the controller 130 performs the program operations, the read operations, the copy operation, the swap operation, and the bad block management operation on the memory blocks of the memory device 150, the queuing modules may become the regions of the memory 144 storing data corresponding to each of the operations. For example, the queuing modules may be buffers or caches included in the memory 144 of the controller 130. Also, although it is described in this embodiment of the present invention that the memory 144 of the controller 130 is allocated with four queuing modules, a plurality of queuing modules may be allocated according to the command operations and the background operation performed on the memory blocks of the memory device 150.

When the controller 130 performs the program operations on the memory blocks of the memory device 150, the data corresponding to the program operations may be stored in a queuing module 1. When the controller 130 performs the read operations on the memory blocks of the memory device 150, the data corresponding to the read operations may be stored in a queuing module 2. When the controller 130 performs the copy operation or the swap operation on the memory blocks of the memory device 150, the data corresponding to the copy operation or the swap operation may be stored in a queuing module 3.

When the controller 130 performs the bad block management operation on the memory blocks where the program failure or the read failure occurs among the memory blocks of the memory device 150, the valid data stored in the memory blocks where the program failure or the read failure occurs may be stored in a queuing module 4. The valid data stored in the queuing module 4 may be stored in the empty memory block, the open memory block, or the free memory block. The memory blocks where the program failure or the read failure occurs may be processed as the bad blocks.

In the memory system according to an embodiment of the present invention, when the controller 130 performs the command operations corresponding to the commands received from the host 102, the memory blocks where the performance failure of the command operations occurs may be detected as the bad blocks, the information representing the bad blocks may be recorded in the list 700 of the bitmap, the valid data of the memory blocks where the performance failure of the command operations occurs may be copied and stored in the normal empty memory block, open memory block or free memory block of the memory device 150, and the memory blocks where the performance failure of the command operations occurs may be processed as the bad blocks. An operation of processing data in the memory system in accordance with an embodiment of the present invention is described in detail below with reference to FIG. 9.

Figure 9:
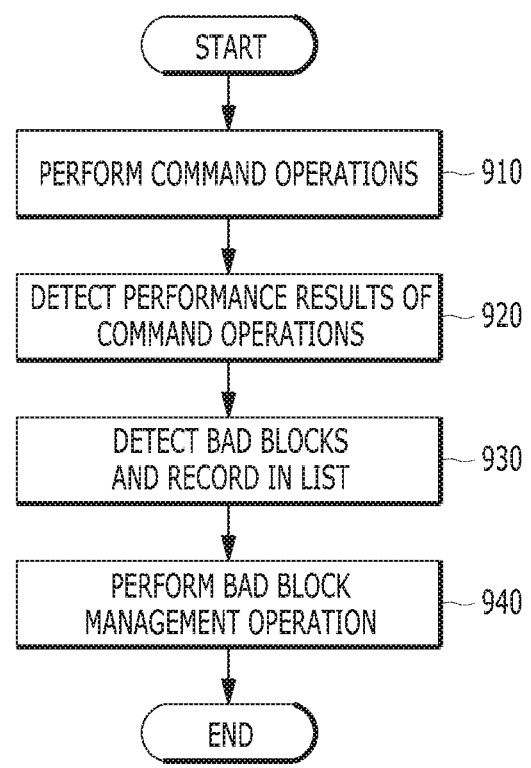
FIG. 9 is a flowchart describing an operation of processing data in a memory system in accordance with an embodiment of the present invention.

FIG. 9 is a flowchart describing an operation of processing data in the memory system in accordance with an embodiment of the present invention.

Referring to FIG. 9, the memory system 110 may receive a plurality of commands from the host 102 and perform command operations corresponding to the commands received from the host 102 on the memory blocks of the memory device 150, in step S910.

In step S920, the memory system 110 may detect performance results of the command operations performed on the memory blocks of the memory device 150.

In step S930, the memory system 110 may detect memory blocks where performance failure of the command operations occurs as bad blocks, and record information representing the bad blocks in the list 700 of a bitmap.

Subsequently, in step S940, the memory system 110 may perform a bad block management operation on the memory blocks where the performance failure of the command operations occurs based on the information representing the bad blocks recorded in the list 700. The memory system 110 may copy and store the valid data stored in the memory blocks where the performance failure of the command operations occurs in the normal empty memory block, open memory block, or free memory block of the memory device 150, and process the memory blocks where the performance failure of the command operations occurs as the bad blocks.

Since performing the command operations corresponding to the commands received from the host 102, detecting the performance results of the command operations performed on the memory blocks of the memory device 150, detecting the memory blocks where the performance failure of the command operations occurs as the bad blocks, recording the information representing the bad blocks in the list 700, and processing the memory blocks as the bad blocks after copying and storing the valid data stored in the memory blocks where the performance failure of the command operations occurs are described above in detail with reference to FIGS. 5 to 8, further description thereof is omitted immediately below. A data processing system and electronic devices to which the memory system 110 including the memory device 150 and the controller 130, which are described above with reference to FIGS. 1 to 9, are described in detail below with reference to FIGS. 10 to 18, in accordance with an embodiment of the present invention.

Figure 10:
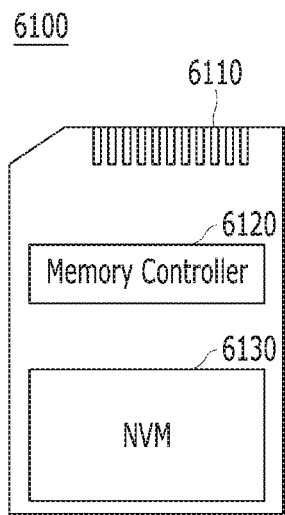
FIGS. 10 to 18 are diagrams schematically illustrating application examples of the data processing system, in accordance with various embodiments of the present invention.

FIG. 10 is a diagram schematically illustrating an example of the data processing system including the memory system in accordance with the present embodiment. Specifically, FIG. 10 schematically illustrates a memory card system to which the memory system in accordance with the present embodiment is applied.

Referring to FIG. 10, the memory card system 6100 may include a memory controller 6120, a memory device 6130 and a connector 6110.

More specifically, the memory controller 6120 may be connected to the memory device 6130, embodied by a nonvolatile memory, and configured to access the memory device 6130. For example, the memory controller 6120 may be configured to control read, write, erase and background operations of the memory device 6130. The memory controller 6120 may be configured to provide an interface between the memory device 6130 and a host, and drive firmware for controlling the memory device 6130. That is, the memory controller 6120 may correspond to the controller 130 of the memory system 110 described with reference to FIG. 1, and the memory device 6130 may correspond to the memory device 150 of the memory system 110 described with reference to FIG. 1.

Thus, the memory controller 6120 may include a RAM, a processing unit, a host interface, a memory interface and an error correction unit.

The memory controller 6120 may communicate with an external device, for example, the host 102 of FIG. 1 through the connector 6110. For example, as described with reference to FIG. 1, the memory controller 6120 may be configured to communicate with an external device through one or more of various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system Interface (SCSI), enhanced small disk interface (EDSI), Integrated Drive Electronics (IDE), Firewire, universal flash storage (UFS), WIFI and Bluetooth. Thus, the memory system and the data processing system in accordance with the present embodiment may be applied to wired/wireless electronic devices or particularly mobile electronic devices.

The memory device 6130 may be implemented by a nonvolatile memory. For example, the memory device 6130 may be implemented by various nonvolatile memory devices such as an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM) and a spin torque transfer magnetic RAM (STT-RAM).

The memory controller 6120 and the memory device 6130 may be integrated into a single semiconductor device. For example, the memory controller 6120 and the memory device 6130 may construct a solid-state driver (SSD) by being integrated into a single semiconductor device. Also, the memory controller 6120 and the memory device 6130 may construct a memory card such as a PC card (PCMCIA: Personal Computer Memory Card International Association), a compact flash (CF) card, a smart media card (e.g., SM and SMC), a memory stick, a multimedia card (e.g., MMC, RS-MMC, MMCmicro and eMMC), an SD card (e.g., SD, miniSD, microSD and SDHC) and a universal flash storage (UFS).

Figure 11:
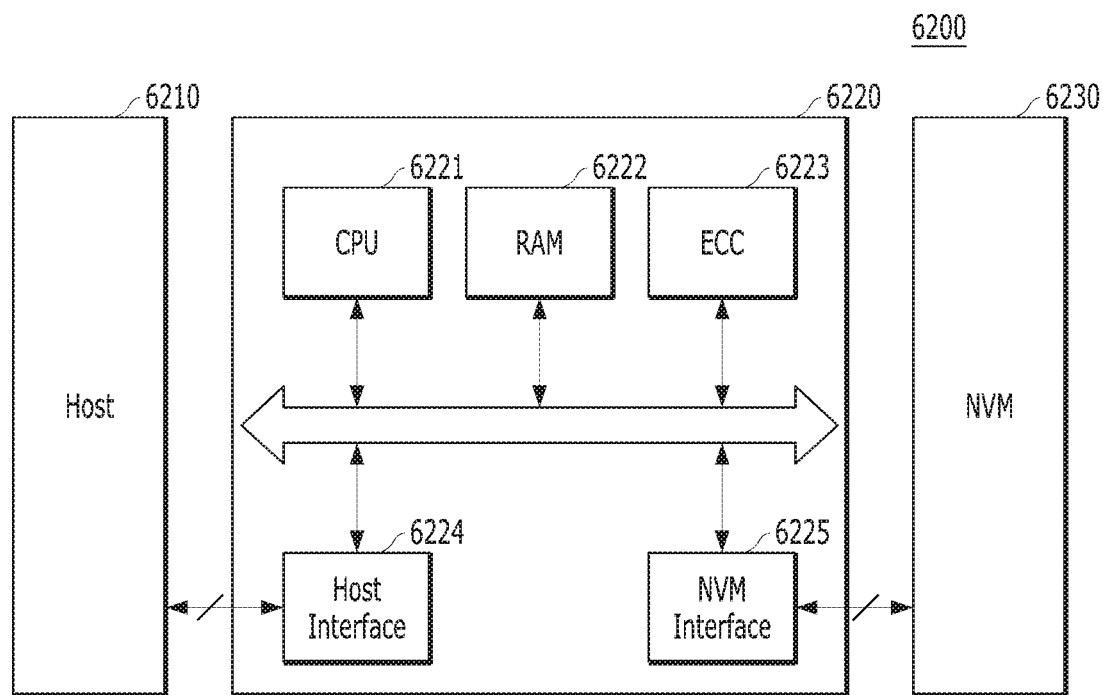

FIG. 11 is a diagram schematically illustrating another example of the data processing system including the memory system in accordance with the present embodiment.

Referring to FIG. 11, the data processing system 6200 may include a memory device 6230 having one or more nonvolatile memories and a memory controller 6220 for controlling the memory device 6230. The data processing system 6200 illustrated in FIG. 11 may serve as a storage medium such as a memory card (CF, SD, micro-SD or the like) or USB device, as described with reference to FIG. 1. The memory device 6230 may correspond to the memory device 150 in the memory system 110 illustrated in FIG. 1, and the memory controller 6220 may correspond to the controller 130 in the memory system 110 illustrated in FIG. 1.

The memory controller 6220 may control a read, write or erase operation on the memory device 6230 in response to a request of the host 6210, and the memory controller 6220 may include one or more CPUs 6221, a buffer memory such as RAM 6222, an ECC circuit 6223, a host interface 6224 and a memory interface such as an NVM interface 6225.

The CPU 6221 may control overall operations on the memory device 6230, for example, read, write, file system management and bad page management operations. The RAM 6222 may be operated according to control of the CPU 6221, and used as a work memory, buffer memory or cache memory. When the RAM 6222 is used as a work memory, data processed by the CPU 6221 may be temporarily stored in the RAM 6222. When the RAM 6222 is used as a buffer memory, the RAM 6222 may be used for buffering data transmitted to the memory device 6230 from the host 6210 or transmitted to the host 6210 from the memory device 6230. When the RAM 6222 is used as a cache memory, the RAM 6222 may assist the low-speed memory device 6230 to operate at high speed.

The ECC circuit 6223 may correspond to the ECC 138 of the controller 130 illustrated in FIG. 1. As described with reference to FIG. 1, the ECC circuit 6223 may generate an ECC (Error Correction Code) for correcting a fail bit or error bit of data provided from the memory device 6230. The ECC circuit 6223 may perform error correction encoding on data provided to the memory device 6230, thereby forming data with a parity bit. The parity bit may be stored in the memory device 6230. The ECC circuit 6223 may perform error correction decoding on data outputted from the memory device 6230. At this time, the ECC circuit 6223 may correct an error using the parity bit. For example, as described with reference to FIG. 1, the ECC circuit 6223 may correct an error using the LDPC code, BCH code, turbo code, Reed-Solomon code, convolution code, RSC or coded modulation such as TCM or BCM.

The memory controller 6220 may transmit/receive data to/from the host 6210 through the host interface 6224, and transmit/receive data to/from the memory device 6230 through the NVM interface 6225. The host interface 6224 may be connected to the host 6210 through a PATA bus, SATA bus, SCSI, USB, PCIe or NAND interface. The memory controller 6220 may have a wireless communication function with a mobile communication protocol such as WiFi or Long Term Evolution (LTE). The memory controller 6220 may be connected to an external device, for example, the host 6210 or another external device, and then transmit/receive data to/from the external device. In particular, as the memory controller 6220 is configured to communicate with the external device through one or more of various communication protocols, the memory system and the data processing system in accordance with the present embodiment may be applied to wired/wireless electronic devices or particularly a mobile electronic device.

Figure 12:
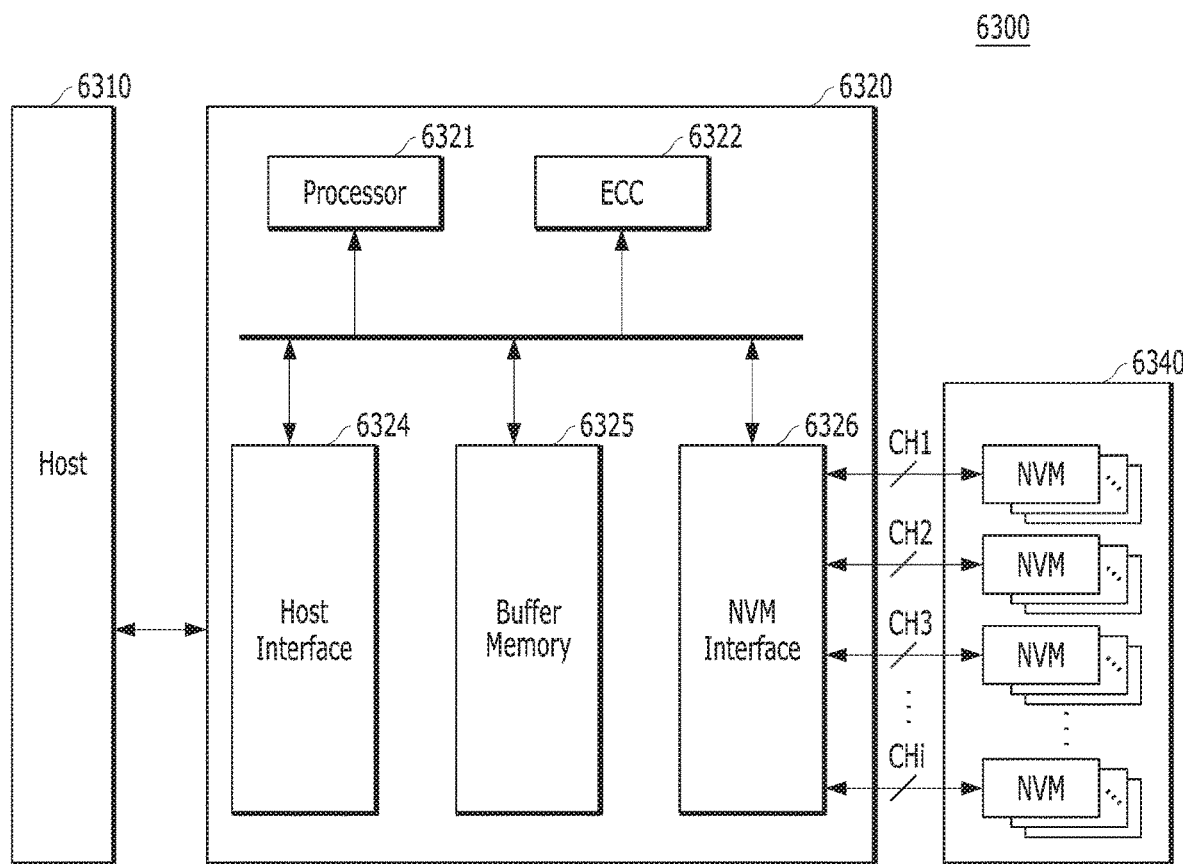

FIG. 12 is a diagram schematically illustrating another example of the data processing system including the memory system in accordance with the present embodiment. Specifically, FIG. 12 schematically illustrates an SSD to which the memory system in accordance with the present embodiment is applied.

Referring to FIG. 12, the SSD 6300 may include a controller 6320 and a memory device 6340 including a plurality of nonvolatile memories. The controller 6320 may correspond to the controller 130 in the memory system 110 of FIG. 1, and the memory device 6340 may correspond to the memory device 150 in the memory system of FIG. 1

More specifically, the controller 6320 may be connected to the memory device 6340 through a plurality of channels CH1 to CHi. The controller 6320 may include one or more processors 6321, a buffer memory 6325, an ECC circuit 6322, a host interface 6324 and a memory interface, for example, a nonvolatile memory interface 6326.

The buffer memory 6325 may temporarily store data provided from the host 6310 or data provided from a plurality of flash memories NVM included in the memory device 6340, or temporarily store meta data of the plurality of flash memories NVM, for example, map data including a mapping table. The buffer memory 6325 may be embodied by volatile memories such as DRAM, SDRAM, DDR SDRAM, LPDDR SDRAM and GRAM or nonvolatile memories such as FRAM, ReRAM, STT-MRAM and PRAM. For convenience of description, FIG. 8 illustrates that the buffer memory 6325 exists in the controller 6320. However, the buffer memory 6325 may exist outside the controller 6320.

The ECC circuit 6322 may calculate an ECC value of data to be programmed to the memory device 6340 during a program operation, perform an error correction operation on data read from the memory device 6340 based on the ECC value during a read operation, and perform an error correction operation on data recovered from the memory device 6340 during a failed data recovery operation.

The host interface 6324 may provide an interface function with an external device, for example, the host 6310, and the nonvolatile memory interface 6326 may provide an interface function with the memory device 6340 connected through the plurality of channels.

Furthermore, a plurality of SSDs 6300 to which the memory system 110 of FIG. 1 is applied may be provided to embody a data processing system, for example, RAID (Redundant Array of Independent Disks) system. At this time, the RAID system may include the plurality of SSDs 6300 and a RAID controller for controlling the plurality of SSDs 6300. When the RAID controller performs a program operation in response to a write command provided from the host 6310, the RAID controller may select one or more memory systems or SSDs 6300 according to a plurality of RAID levels, that is, RAID level information of the write command provided from the host 6310 in the SSDs 6300, and output data corresponding to the write command to the selected SSDs 6300. Furthermore, when the RAID controller performs a read command in response to a read command provided from the host 6310, the RAID controller may select one or more memory systems or SSDs 6300 according to a plurality of RAID levels, that is, RAID level information of the read command provided from the host 6310 in the SSDs 6300, and provide data read from the selected SSDs 6300 to the host 6310.

Figure 13:
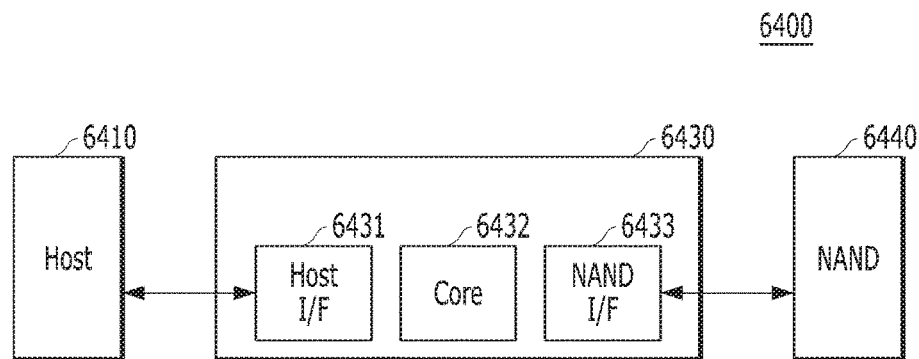

FIG. 13 is a diagram schematically illustrating another example of the data processing system including the memory system in accordance with the present embodiment. Specifically, FIG. 13 schematically illustrates an embedded Multi-Media Card (eMMC) to which the memory system in accordance with the present embodiment is applied.

Referring to FIG. 13, the eMMC 6400 may include a controller 6430 and a memory device 6440 embodied by one or more NAND flash memories. The controller 6430 may correspond to the controller 130 in the memory system 110 of FIG. 1, and the memory device 6440 may correspond to the memory device 150 in the memory system 110 of FIG. 1.

More specifically, the controller 6430 may be connected to the memory device 6440 through a plurality of channels. The controller 6430 may include one or more cores 6432, a host interface 6431 and a memory interface, for example, a NAND interface 6433.

The core 6432 may control overall operations of the eMMC 6400, the host interface 6431 may provide an interface function between the controller 6430 and the host 6410, and the NAND interface 6433 may provide an interface function between the memory device 6440 and the controller 6430. For example, the host interface 6431 may serve as a parallel interface, for example, MMC interface as described with reference to FIG. 1. Furthermore, the host interface 6431 may serve as a serial interface, for example, UHS ((Ultra High Speed)-I/UHS-II) interface.

FIGS. 14 to 17 are diagrams schematically illustrating other examples of the data processing system including the memory system in accordance with the present embodiment. Specifically, FIGS. 13 to 16 schematically illustrate universal flash storage (UFS) systems to which the memory system in accordance with the present embodiment is applied.

Referring to FIGS. 14 to 17, the UFS systems 6500, 6600, 6700 and 6800 may include hosts 6510, 6610, 6710 and 6810, UFS devices 6520, 6620, 6720 and 6820 and UFS cards 6530, 6630, 6730 and 6830, respectively. The hosts 6510, 6610, 6710 and 6810 may serve as application processors of wired/wireless electronic devices including mobile electronic devices, the UFS devices 6520, 6620, 6720 and 6820 may serve as embedded UFS devices, and the UFS cards 6530, 6630, 6730 and 6830 may serve as external embedded UFS devices or removable UFS cards.

The hosts 6510, 6610, 6710 and 6810, the UFS devices 6520, 6620, 6720 and 6820 and the UFS cards 6530, 6630, 6730 and 6830 in the respective UFS systems 6500, 6600, 6700 and 6800 may communicate with external devices, for example, wired/wireless electronic devices or particularly mobile electronic devices through UFS protocols, and the UFS devices 6520, 6620, 6720 and 6820 and the UFS cards 6530, 6630, 6730 and 6830 may be embodied by the memory system 110 illustrated in FIG. 1. For example, in the UFS systems 6500, 6600, 6700 and 6800, the UFS devices 6520, 6620, 6720 and 6820 may be embodied in the form of the data processing system 6200, the SSD 6300 or the eMMC 6400 described with reference to FIGS. 11 to 13, and the UFS cards 6530, 6630, 6730 and 6830 may be embodied in the form of the memory card system 6100 described with reference to FIG. 10.

Furthermore, in the UFS systems 6500, 6600, 6700 and 6800, the hosts 6510, 6610, 6710 and 6810, the UFS devices 6520, 6620, 6720 and 6820 and the UFS cards 6530, 6630, 6730 and 6830 may communicate with each other through an UFS interface, for example, MIPI M-PHY and MIPI UniPro (Unified Protocol) in MIPI (Mobile Industry Processor Interface). Furthermore, the UFS devices 6520, 6620, 6720 and 6820 and the UFS cards 6530, 6630, 6730 and 6830 may communicate with each other through various protocols other than the UFS protocol, for example, UFDs, MMC, SD, mini-SD, and micro-SD.

Figure 14:
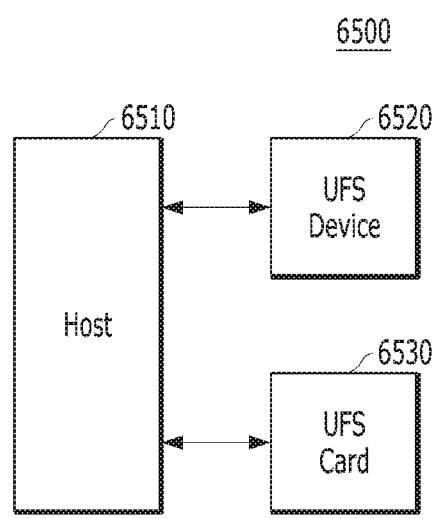

In the UFS system 6500 illustrated in FIG. 14, each of the host 6510, the UFS device 6520 and the UFS card 6530 may include UniPro. The host 6510 may perform a switching operation in order to communicate with the UFS device 6520 and the UFS card 6530. In particular, the host 6510 may communicate with the UFS device 6520 or the UFS card 6530 through link layer switching, for example, L3 switching at the UniPro. The UFS device 6520 and the UFS card 6530 may communicate with each other through link layer switching at the UniPro of the host 6510. In the present embodiment, the configuration in which one UFS device 6520 and one UFS card 6530 are connected to the host 6510 is described by way of example. However, a plurality of UFS devices and UFS cards may be connected in parallel or in the form of a star to the host 6410, and a plurality of UFS cards may be connected in parallel or in the form of a star to the UFS device 6520 or connected in series or in the form of a chain to the UFS device 6520.

Figure 15:
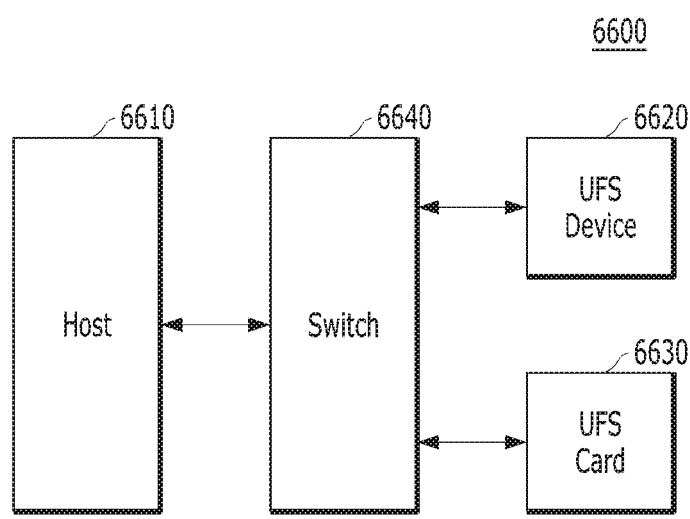

In the UFS system 6600 illustrated in FIG. 15, each of the host 6610, the UFS device 6620 and the UFS card 6630 may include UniPro, and the host 6610 may communicate with the UFS device 6620 or the UFS card 6630 through a switching module 6640 performing a switching operation, for example, through the switching module 6640 which performs link layer switching at the UniPro, for example, L3 switching. The UFS device 6620 and the UFS card 6630 may communicate with each other through link layer switching of the switching module 6640 at UniPro. In the present embodiment, the configuration in which one UFS device 6620 and one UFS card 6630 are connected to the switching module 6640 is described by way of example. However, a plurality of UFS devices and UFS cards may be connected in parallel or in the form of a star to the switching module 6640, and a plurality of UFS cards may be connected in series or in the form of a chain to the UFS device 6620.

Figure 16:
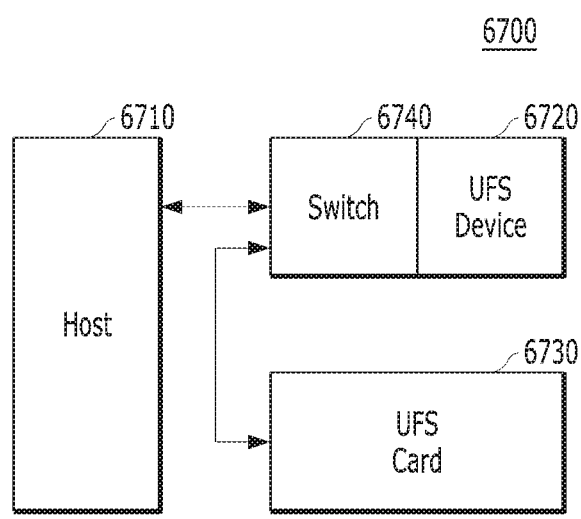

In the UFS system 6700 illustrated in FIG. 16, each of the host 6710, the UFS device 6720 and the UFS card 6730 may include UniPro, and the host 6710 may communicate with the UFS device 6720 or the UFS card 6730 through a switching module 6740 performing a switching operation, for example, through the switching module 6740 which performs link layer switching at the UniPro, for example, L3 switching. The UFS device 6720 and the UFS card 6730 may communicate with each other through link layer switching of the switching module 6740 at the UniPro, and the switching module 6740 may be integrated as one module with the UFS device 6720 inside or outside the UFS device 6720. In the present embodiment, the configuration in which one UFS device 6720 and one UFS card 6730 are connected to the switching module 6740 is described by way of example. However, a plurality of modules each including the switching module 6740 and the UFS device 6720 may be connected in parallel or in the form of a star to the host 6710 or connected in series or in the form of a chain to each other. Furthermore, a plurality of UFS cards may be connected in parallel or in the form of a star to the UFS device 6720.

Figure 17:
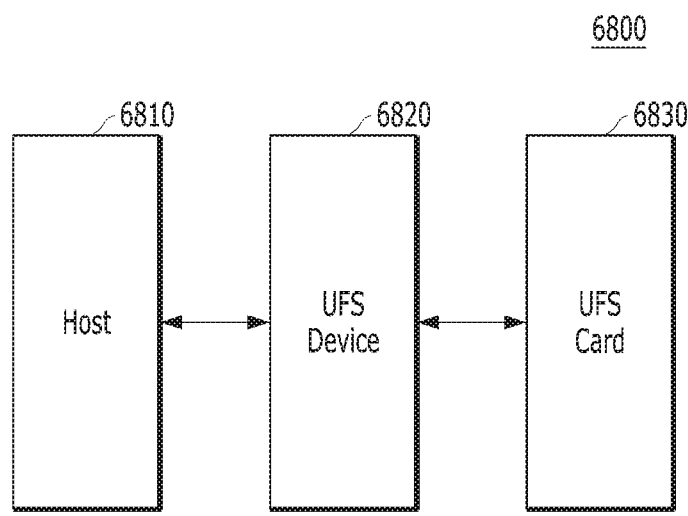

In the UFS system 6800 illustrated in FIG. 17, each of the host 6810, the UFS device 6820 and the UFS card 6830 may include M-PHY and UniPro. The UFS device 6820 may perform a switching operation in order to communicate with the host 6810 and the UFS card 6830. In particular, the UFS device 6820 may communicate with the host 6810 or the UFS card 6830 through a switching operation between the M-PHY and UniPro module for communication with the host 6810 and the M-PHY and UniPro module for communication with the UFS card 6830, for example, through a target ID (Identifier) switching operation. The host 6810 and the UFS card 6830 may communicate with each other through target ID switching between the M-PHY and UniPro modules of the UFS device 6820. In the present embodiment, the configuration in which one UFS device 6820 is connected to the host 6810 and one UFS card 6830 is connected to the UFS device 6820 is described by way of example. However, a plurality of UFS devices may be connected in parallel or in the form of a star to the host 6810, or connected in series or in the form of a chain to the host 6810, and a plurality of UFS cards may be connected in parallel or in the form of a star to the UFS device 6820, or connected in series or in the form of a chain to the UFS device 6820.

Figure 18:
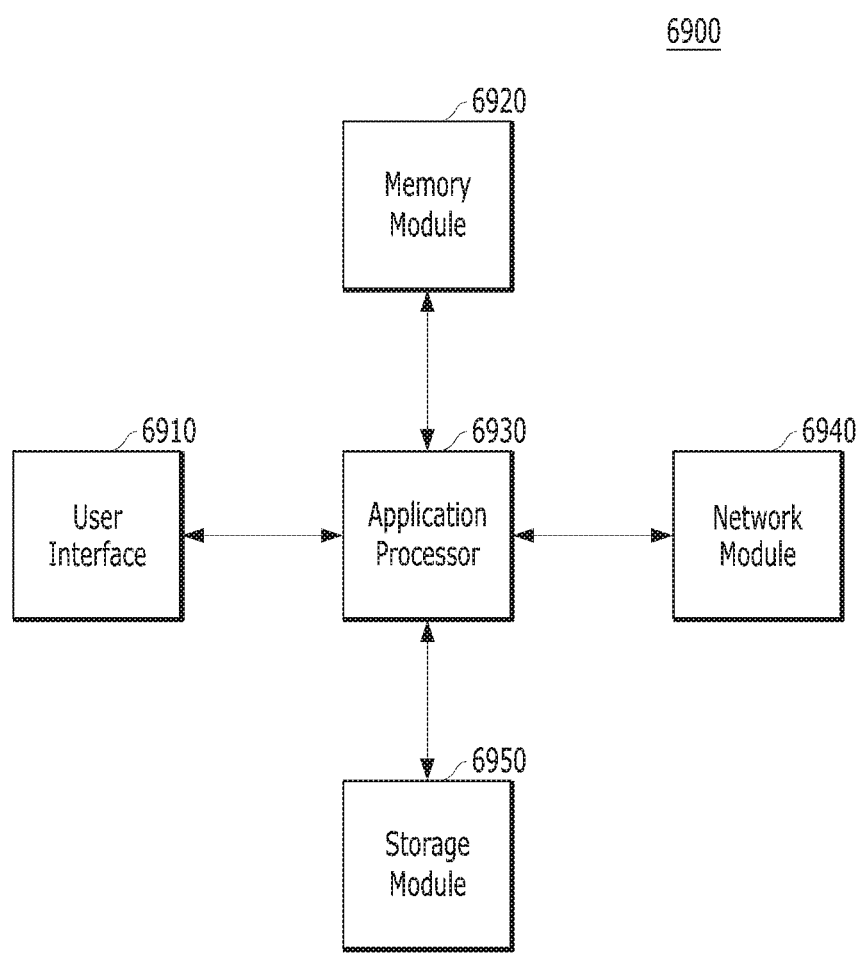

FIG. 18 is a diagram schematically illustrating another example of the data processing system including the memory system in accordance with an embodiment of the present invention, and more particularly illustrating a user system to which the memory system in accordance with the present embodiment is applied.

Referring to FIG. 18, the user system 6900 may include an application processor 6930, a memory module 6920, a network module 6940, a storage module 6950 and a user interface 6910.

More specifically, the application processor 6930 may drive components included in the user system 6900, for example, an OS, and include controllers, interfaces and a graphic engine which control the components included in the user system 6900. The application processor 6930 may be provided as System-on-Chip (SoC).

The memory module 6920 may be used as a main memory, work memory, buffer memory or cache memory of the user system 6900. The memory module 6920 may include a volatile RAM such as DRAM, SDRAM, DDR SDRAM, DDR2 SDRAM, DDR3 SDRAM, LPDDR SDARM, LPDDR3 SDRAM or LPDDR3 SDRAM or a nonvolatile RAM such as PRAM, ReRAM, MRAM or FRAM. For example, the application processor 6930 and the memory module 6920 may be packaged and mounted, based on POP (Package on Package).

The network module 6940 may communicate with external devices. For example, the network module 6940 may not only support wired communication, but also support various wireless communication protocols such as code division multiple access (CDMA), global system for mobile communication (GSM), wideband CDMA (WCDMA), CDMA-2000, time division multiple access (TDMA), long term evolution (LTE), worldwide interoperability for microwave access (Wimax), wireless local area network (WLAN), ultra-wideband (UWB), Bluetooth, wireless display (WI-DI), thereby communicating with wired/wireless electronic devices including mobile electronic devices. Therefore, the memory system and the data processing system, in accordance with an embodiment of the present invention, can be applied to wired/wireless electronic devices. The network module 6940 may be included in the application processor 6930.

The storage module 6950 may store data, for example, data received from the application processor 6930, and then may transmit the stored data to the application processor 6930. The storage module 6950 may be embodied by a nonvolatile semiconductor memory device such as a phase-change RAM (PRAM), a magnetic RAM (MRAM), a resistive RAM (ReRAM), a NAND flash, NOR flash and 3D NAND flash, and provided as a removable storage medium such as a memory card or external drive of the user system 6900. The storage module 6950 may correspond to the memory system 110 described with reference to FIG. 1. Furthermore, the storage module 6950 may be embodied as an SSD, eMMC and UFS as described above with reference to FIGS. 12 to 17.

The user interface 6910 may include interfaces for inputting data or commands to the application processor 6930 or outputting data to an external device. For example, the user interface 6910 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, an LED, a speaker and a motor.

Furthermore, when the memory system 110 of FIG. 1 is applied to a mobile electronic device of the user system 6900, the application processor 6930 may control overall operations of the mobile electronic device, and the network module 6940 may serve as a communication module for controlling wired/wireless communication with an external device. The user interface 6910 may display data processed by the processor 6930 on a display/touch module of the mobile electronic device, or support a function of receiving data from the touch panel.

According to embodiments of the present invention, a memory system and an operating method thereof are capable of processing data to a memory device quickly and stably by minimizing the complexity and performance deterioration of the memory system and maximizing the utility efficiency of the memory device.

While the present invention has been described with respect to various embodiments, it will be apparent to those skilled in the art from the foregoing description that various changes and modifications may be made without departing from the spirit and scope of the invention as defined in the following claims.

What is claimed is:

1. A memory system, comprising:
   a memory device that includes a plurality of dies, each of the plurality of dies including a plurality of planes, each of the plurality of planes including a plurality of memory blocks, each of which includes a plurality of pages that store data; and
   a controller configured to control the memory device to perform command operations, detect results of the command operations performed on the memory device, detect first memory regions where the command operations failed as bad memory regions and move valid data in the first memory regions to second memory regions of the memory device,
   wherein the controller maintains information including physical location of the bad memory regions,
   wherein the controller includes a scheduler configured to schedule move operations based on a current version of the information representing the bad memory regions, the controller further configured to update the information.

2. The memory system of claim 1, wherein the controller records the information representing the bad memory regions in a list in a form of a bitmap, and stores the list in a memory of the controller.

3. The memory system of claim 2, wherein the list specifies the physical location of the bad memory regions by planes and dies to which the bad memory regions belong.

4. The memory system of claim 3, wherein the bad memory regions are bad blocks, and
   wherein the controller records the information representing the bad blocks among the memory blocks in a first plane of a first memory die in a first bit region of a first row of the list, and records the information representing the bad blocks among the memory blocks in a second plane of the first memory die in a second bit region of the first row of the list.

5. The memory system of claim 4, wherein the controller records the information representing the bad blocks among the memory blocks in a first plane of a second memory die in a first bit region of a second row of the list, and records the information representing the bad blocks among the memory blocks in a second plane of the second memory die in a second bit region of the second row of the list.

6. The memory system of claim 1, wherein the controller allocates first queues corresponding to the command operations and second queues corresponding to first memory blocks to a memory of the controller.

7. The memory system of claim 6, wherein the controller stores the valid data in the second queues, and subsequently stores the valid data stored in the second queues in pages of second memory blocks.

8. The memory system of claim 1, wherein the controller processes first memory blocks as closed memory blocks.

9. The memory system of claim 1, wherein the valid data are stored in valid pages where performance success of the command operations occurs among pages in first memory blocks.

10. A memory system, comprising:
    a memory device that includes a plurality of dies, each of the plurality of dies including a plurality of planes, each of the plurality of planes including a plurality of memory blocks, each of which includes a plurality of pages that store data; and
    a controller configured to control the memory device to perform command operations, detect results of the command operations performed on the memory device, detect first memory regions where the command operations failed as bad memory regions and move valid data in the first memory regions to second memory regions of the memory device, wherein the controller maintains information including physical location of the bad memory regions, wherein the controller includes a plurality of queues and a scheduler, wherein one of the plurality of queues includes the valid data stored in the bad memory regions to move the valid data and other queues of the plurality of queues includes data for the command operations, and wherein the scheduler schedules the plurality of queues.

11. The memory system of claim 10, wherein the controller performs the command operation on super memory blocks, and performs move operation on the bad memory region.

12. The memory system of claim 11, wherein the controller updates the information by adding a super memory block including a newly detected bad memory region based on the command operation to the information.

13. The memory system of claim 10, wherein the controller records the information representing the bad memory region in a list in a form of a bitmap, and wherein when a new bad memory region is detected from the memory device, the controller updates the list through a mathematical operation in the bitmap.

* * * * *